United States Patent
Jeong et al.

(10) Patent No.: US 11,929,386 B2
(45) Date of Patent: Mar. 12, 2024

(54) DISPLAY DEVICE AND TILED DISPLAY DEVICE INCLUDING THE SAME

(71) Applicant: Samsung Display Co., LTD., Yongin-si (KR)

(72) Inventors: Se Hoon Jeong, Suwon-si (KR); Seung Wook Kwon, Hwaseong-si (KR); Seo Yeon Lee, Namyangju-si (KR); Seung Gun Chae, Hwaseong-si (KR); Woo Yong Sung, Seoul (KR); Seung Yeon Chae, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 454 days.

(21) Appl. No.: 17/349,495

(22) Filed: Jun. 16, 2021

(65) Prior Publication Data

US 2022/0093677 A1    Mar. 24, 2022

(30) Foreign Application Priority Data

Sep. 24, 2020    (KR) ........................ 10-2020-0123599

(51) Int. Cl.
*H01L 27/15*    (2006.01)
*G09F 9/33*    (2006.01)
(Continued)

(52) U.S. Cl.
CPC .............. *H01L 27/156* (2013.01); *G09F 9/33* (2013.01); *H01L 33/56* (2013.01); *H01L 33/62* (2013.01)

(58) Field of Classification Search
None
See application file for complete search history.

(56) References Cited

U.S. PATENT DOCUMENTS

2018/0138260 A1*   5/2018   Kajiyama ............ H10K 59/124
2019/0035820 A1*   1/2019   Yanaka ................. H10K 71/80

FOREIGN PATENT DOCUMENTS

JP         2017-161887      9/2017
KR    10-2016-0099999      8/2016

OTHER PUBLICATIONS

Catia Silva et al., "Fabrication and characterization of polymeric three-axis thermal accelerometers", Journal of Micromechanics and Microengineering, Jul. 14, 2015, pp. 1-13, vol. 25.

(Continued)

*Primary Examiner* — Robert K Carpenter
(74) *Attorney, Agent, or Firm* — KILE PARK REED & HOUTTEMAN PLLC

(57) ABSTRACT

A display device includes a display layer including pixels each including at least one transistor, a connection wiring electrically connected to the at least one transistor and exposed to a lower surface of the display layer through a first contact hole in the display layer, a base member disposed under the display layer and including a first hole exposing the connection wiring exposed to the lower surface of the display layer, a first lower protective layer disposed on a lower surface of the base member and including a second hole overlapping the first hole, a pad portion disposed on a lower surface of the first lower protective layer, and a lead line disposed on the lower surface of the first lower protective layer and electrically connecting the pad portion and the connection wiring. A tiled display device includes multiple display devices.

20 Claims, 32 Drawing Sheets

(51) Int. Cl.
*H01L 33/56* (2010.01)
*H01L 33/62* (2010.01)

(56) References Cited

OTHER PUBLICATIONS

Yeon-Hyun Park et al., "Capacitively Coupled SF6, SF6/O2, SF6/CH4 Plasma Etching of Acrylic at Low Vacuum Pressure", Kor. J. Mater. Res., 2009, pp. 68-72, vol. 19, No. 2.

* cited by examiner

DISPLAY DEVICE AND TILED DISPLAY DEVICE INCLUDING THE SAME

CROSS-REFERENCE TO RELATED APPLICATION(S)

This application claims priority to and benefits of Korean Patent Application No. 10-2020-0123599, filed on Sep. 24, 2020 in the Korean Intellectual Property Office, the entire contents of which are incorporated herein by reference.

BACKGROUND

1. Technical Field

The disclosure relates to a display device and a tiled display device including the same.

2. Description of the Related Art

With the development of information society, requirements for display devices for displaying images have increased in various forms. For example, display devices are applied to various electronic appliances such as smart phones, digital cameras, notebook computers, navigators, and smart televisions. A display device may be a flat panel display device such as a liquid crystal display device, a field emission display device, or a light emitting display device such as an organic light emitting display device. Since a light emitting display device includes light emitting elements by which each of the pixels in a display panel may emit light by themselves, an image may be displayed without need for a backlight unit providing light to the display panel.

In case that a display device is manufactured in a large size, a defective rate of light emitting elements may increase due to an increase in the number of pixels, and productivity or reliability may deteriorate. In order to solve the above problem, a tiled display device may implement a large-sized screen by connecting multiple display devices having relatively small sizes. The tiled display device may include a boundary portion called a seam between the display devices due to the non-display area or bezel area of each of the display devices adjacent to each other. In case that a single image is displayed on the entire screen (e.g., entire tiled display), the boundary portion between the display devices gives a disconnection sensation on the entire screen, thereby reducing image quality (e.g., image immersion).

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

An aspect of the disclosure may provide a tiled display device capable of removing a disconnection sensation between multiple display devices and improving image quality (e.g., image immersion) by preventing a boundary portion of a coupling area between the display devices or a non-display area from being visually recognized.

In a process of manufacturing a display device, a first lower protective layer may be used as an etching mask and may serve a lower protective layer by using the first lower protective layer as the etching mask during an etching process of forming a first hole penetrating a base member and a barrier layer, so that a process for forming an additional lower protective layer may be omitted. Accordingly, another aspect of the disclosure may provide a display device having improved economical efficiency and a tiled display device including the same.

According to an aspect of an embodiment, a display device may include a display layer including pixels each including at least one transistor, a connection wiring electrically connected to the at least one transistor and exposed to a lower surface of the display layer through a first contact hole in the display layer, a base member disposed under the display layer and including a first hole exposing the connection wiring exposed to the lower surface of the display layer, a first lower protective layer disposed on a lower surface of the base member and including a second hole overlapping the first hole in a thickness direction of the base member, a pad portion disposed on a lower surface of the first lower protective layer, and a lead line disposed on the lower surface of the first lower protective layer and electrically connecting the pad portion and the connection wiring.

In an embodiment, the first lower protective layer may not be disposed on a side surface of the base member constituting a sidewall of the first hole.

In an embodiment, the first lower protective layer may completely overlap the lower surface of the base member.

In an embodiment, a side surface of the first lower protective layer constituting a sidewall of the second hole may be aligned in parallel with the side surface of the base member constituting the sidewall of the first hole.

In an embodiment, a side surface of the first lower protective layer constituting a sidewall of the second hole may be aligned outward from the side surface of the base member constituting the sidewall of the first hole.

In an embodiment, the first lower protective layer may have an under-cut shape protruding from the side surface of the base member.

In an embodiment, the lead line may be electrically connected to the connection wiring through the first hole and the second hole.

In an embodiment, the lead line may extend from the lower surface of the first lower protective layer and may be disposed on a side surface of the first lower protective layer constituting a sidewall of the second hole and a side surface of the base member constituting a sidewall of the first hole.

In an embodiment, the display device may include a lead contact portion filling a space defined by the first hole and the second hole, wherein the lead contact portion may be electrically connected to the connection wiring through the first hole and the second hole, and the lead line may be electrically connected to the connection wiring through the lead contact portion.

In an embodiment, the first lower protective layer may expose a part of the lower surface of the base member in an area adjacent to the first hole.

In an embodiment, the base member may include polyimide, and the first lower protective layer may include a material having a different etching selectivity from a material of the base member.

In an embodiment, the first lower protective layer may include an acrylic resin.

In an embodiment, the display device may include a second lower protective layer overlapping the lower surface of the first lower protective layer and the lead line.

In an embodiment, the pad portion may be spaced apart from the first contact hole, and the lead line may be disposed between the pad portion and the connection wiring.

In an embodiment, the display device may include a barrier layer disposed between the display layer and the base member, wherein the barrier layer may include a third hole exposing the connection wiring, and the third hole may be connected to the first hole.

According to an aspect of another embodiment, a tiled display device may include a plurality of display devices each including a display area and a non-display area surrounding the display area, wherein each of the plurality of display devices may include a display layer including pixels each including at least one transistor, a connection wiring electrically connected to the at least one transistor and exposed to a lower surface of the display layer through a first contact hole provided in the display layer, a base member disposed under the display layer and including a first hole exposing the connection wiring exposed to the lower surface of the display layer, a first lower protective layer disposed on a lower surface of the base member and including a second hole overlapping the first hole in a thickness direction of the base member, a pad portion disposed on a lower surface of the first lower protective layer, and a lead line disposed on the lower surface of the first lower protective layer and electrically connecting the pad portion and the connection wiring.

In an embodiment, the first lower protective layer may not be disposed on a side surface of the base member constituting a sidewall of the first hole.

In an embodiment, the first lower protective layer may completely overlap the lower surface of the base member.

In an embodiment, the base member may include polyimide, and the first lower protective layer may include an acrylic resin.

In an embodiment, the lead line may be electrically connected to the connection wiring through the first hole and the second hole.

According to a display device according to embodiments and a tiled display device including the same, the distance between the display areas of each of the display devices may be so close that the combined area between the display devices may not be recognized by the user. Accordingly, the tiled display device may prevent a user from recognizing a combined region between display devices, thereby removing a sense of disconnection between the display devices and improving image quality (e.g., image immersion).

Also, a first lower protective layer may be used as an etching mask in an etching process in which a first hole through the base member and the barrier layer may be formed, and may also serve as a lower protective layer. Accordingly, a photoresist layer coating, exposure and development process for forming a photoresist pattern for forming a separate etching mask, and an ashing or stripping process for removing the photoresist pattern may be omitted. A process for additionally forming the lower protective layer may be omitted. Accordingly, the economic efficiency of the manufacturing process of the display device can be improved.

However, aspects of the disclosure are not restricted to the above. Rather, the above and other aspects of the disclosure will become more apparent to one of ordinary skill in the art to which the disclosure pertains by referencing the detailed description of the disclosure given below.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
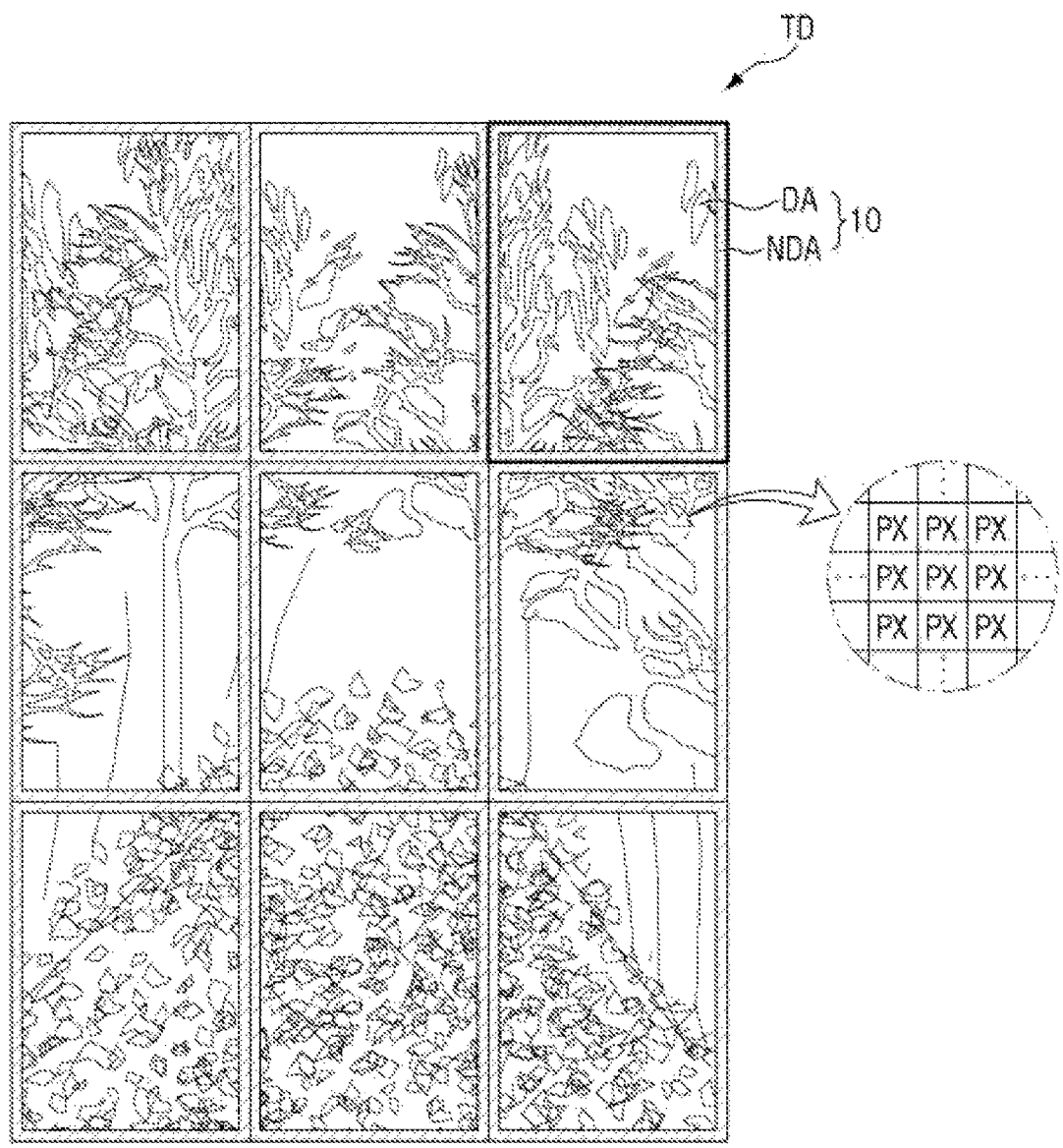
FIG. 1 is a schematic plan view of a tiled display device according to an embodiment.
Figure 1:

The disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

As used herein, the singular forms, "a," "an," and "the" are intended to include the plural forms as well (and vice versa), unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will also be understood that when a layer is referred to as being "on" or "connected to" another layer or substrate, it can be directly on or connected to the other layer or substrate, or intervening layers may also be present. The same reference numbers indicate the same components throughout the specification.

It will be understood that the terms "connected to" or "coupled to" may include a physical or electrical connection or coupling.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, extending under, covering, or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

"About", "approximately", and "substantially" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

FIG. 1 is a schematic plan view of a tiled display device according to an embodiment.

Referring to FIG. 1, a tiled display device TD may display a mobile image or a still image. The tiled display device TD may refer to any electronic device that provides a display screen. Examples of the tiled display device TD may include televisions, notebook computers, monitors, billboards, Internet of things (IoT) devices, mobile phones, smart phones, tablet personal computers (tablet PCs), electronic watches, smart watches, watch phones, mobile communication terminals, electronic notebooks, electronic books, portable multimedia players (PMPs), navigators, game machines, digital cameras, and camcorders.

Hereinafter, in the drawings for illustrating the tiled display device TD, a first direction DR1, a second direction DR2, and a third direction DR3 are defined. The first direction DR1 and the second direction DR2 may be directions perpendicular to each other in one plane. The third direction DR3 may be a direction perpendicular to the plane in which the first direction DR1 and the second direction DR2 are located. The third direction DR3 may be perpendicular to each of the first direction DR1 and the second direction DR2. Hereinafter, in embodiments explaining the tiled display device TD, the third direction DR3 may represent a thickness direction (or a display direction) of the tiled display device TD.

In embodiments explaining the structures of the tile type display device TD and the display device 10, unless otherwise stated, the "upper" may refer to a side on which a display layer DPL may be disposed with respect to a base member SUB toward one side in the third direction DR3, and the "upper surface" may refer to a surface facing one side in the third direction DR3. Further, the "lower" may refer to the other side toward a direction opposite to the third direction DR3, and the "lower surface" may refer to a surface facing the other side in the third direction DR3.

The tiled display device TD may have a rectangular shape including short sides in the first direction DR1 and long sides in the second direction DR2 in a plan view. The tiled display device TD may have an overall planar shape, but the shape thereof is not limited thereto.

The tiled display device TD according to an embodiment may include multiple display devices 10.

The display devices 10 may be arranged in a matrix shape. The display devices 10 may be arranged along the first direction DR1 and the second direction DR2 in a plan view. Although it is illustrated in the drawings that display devices 10 are arranged in a matrix shape of 3×3, the number and arrangement of the display devices 10 are not limited thereto.

The display devices 10 may be connected to each other in the first direction DR1 and the second direction DR2, and the tiled display device TD may have a specific shape. Although it is illustrated in the drawings that the arrangement direction of the display devices 10 coincides with the first direction DR1 and the second direction DR2, which may be extension directions of the long sides and short sides of the tiled display device TD, the disclosure is not limited thereto, and the arrangement direction of the display devices 10 and the extension directions of the long sides and short sides of the tiled display device TD may be inclined with a predetermined inclination.

Each of the display devices 10 may have a rectangular shape including short sides in the first direction DR1 and long sides in the second direction DR2 in a plan view. The display devices 10 may have long sides or short sides connected to each other. Some of the display devices 10 included in the tiled display device TD may be disposed at the edge of the tiled display device TD to form a side of the tiled display device TD. Other some of the display devices 10 included in the tiled display device TD may be disposed at each corner of the tiled display device TD to form two adjacent sides. Others of the display devices 10 included in the tiled display device TD may be disposed inside the tiled display device TD, and may be surrounded by other display devices 10.

Each of the display devices 10 may include a display panel for providing a display screen. Examples of the display panel may include an inorganic light emitting diode display panel, an organic light emitting display panel, a quantum dot light emitting display panel, a plasma display panel, and a field emission display panel. Hereinafter, a case where an inorganic light emitting diode display panel may be used as the display panel will be described as an example, but the disclosure is not limited thereto. Other display panels may be applied in keeping with the same technical spirit.

The display device 10 may include a display area DA and a non-display area NDA. The display area DA may include pixels to display an image. The non-display area NDA may be disposed around the display area DA to surround the display area DA, and may not display an image.

The tiled display device TD may have a planar shape as a whole, but the disclosure is not limited thereto. The tiled display device TD may have a three-dimensional shape, thereby providing a three-dimensional effect to a user. For example, in case that the tiled display device TD has a three-dimensional shape, at least some of the display devices 10 may have a curved shape. As another example, the display devices 10 may have a planar shape and an area connected to each other at a predetermined angle, so that the tiled display device TD may have a three-dimensional shape.

Figure 2:
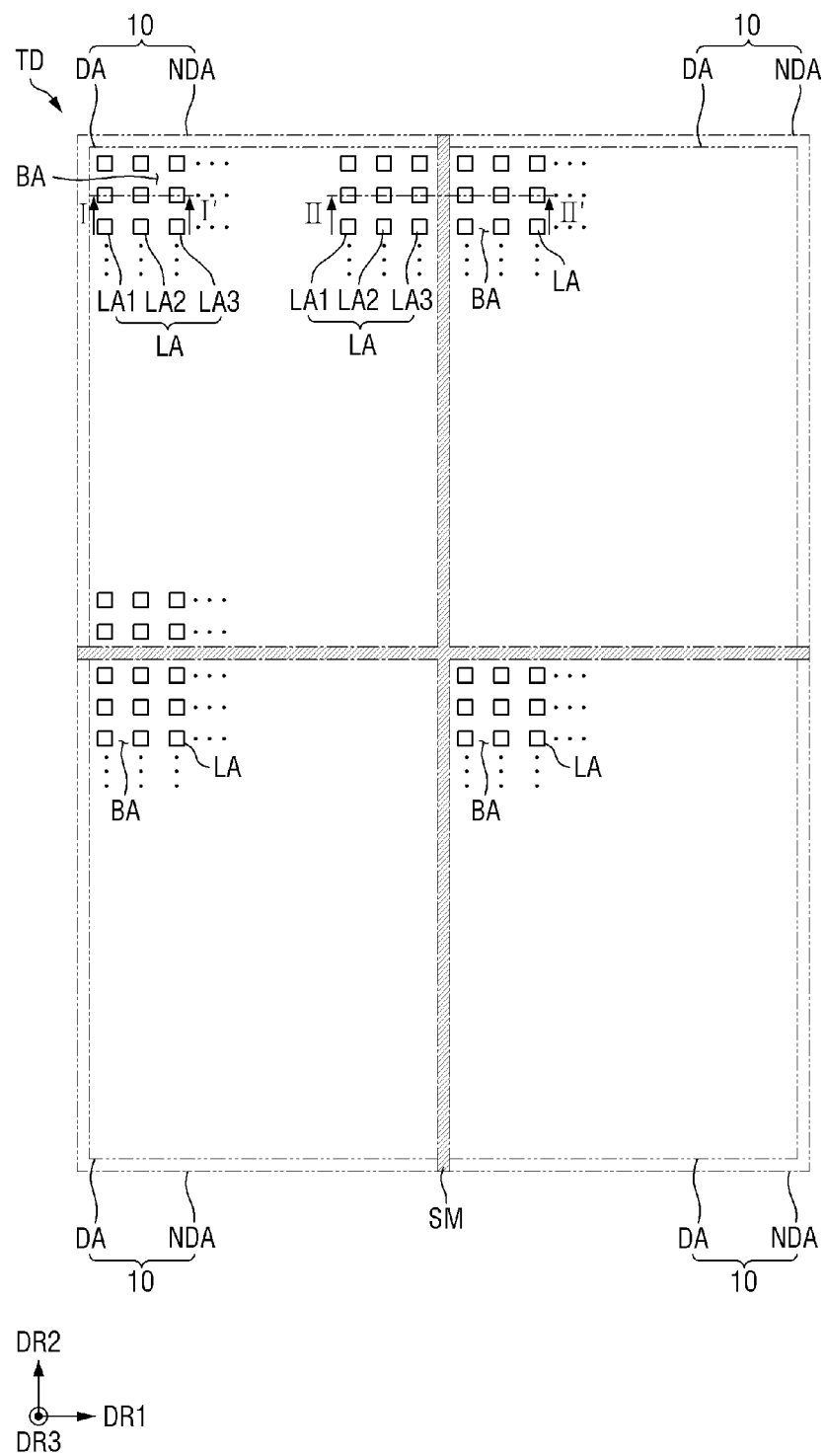
FIG. 2 is a schematic plan view illustrating a part of a tiled display device according to an embodiment.

FIG. 2 is a schematic plan view illustrating a part of a tiled display device according to an embodiment.

For convenience of explanation, FIG. 2 illustrates only some of the display devices 10 included in the tiled display device TD according to an embodiment. Referring to FIGS. 1 and 2, as described above, each of the display devices 10 may include a display area DA and a non-display area NDA.

The shape of the display area DA may correspond to the shape of the display device 10. For example, the shape of the display area DA may have a planar rectangular shape similar to the overall shape of the display device 10. The display area DA may generally occupy the center of the display device 10.

The non-display area NDA may be disposed around the display area DA. The non-display area NDA may entirely or partially surround the display area DA.

The tiled display device TD may further include a boundary area SM including an area in which adjacent display devices 10 may be connected to each other. The boundary area SM may be disposed between the display areas DA of the adjacent display devices 10. The boundary area SM may include an area in which a connection member for connecting the non-display areas of the adjacent display devices 10 may be disposed. The display devices 10 may be connected to each other through a connection member or an adhesive member disposed in the boundary area SM.

The distance between the display areas DA of each of the display devices 10 may be close to such a degree that the boundary area SM between the display devices 10 may not be recognized by a user. The external light reflectance of the display area DA of each of the display devices 10 may be substantially the same as the external light reflectance of the boundary area SM between the display devices 10. Accordingly, the tiled display device TD may remove the disconnection sensation between the display devices and improve image quality (e.g., image immersion) by preventing the boundary area SM between the display devices from being visually recognized by the user.

As described above, the display area DA may include pixels PX. The pixels PX may be arranged in a matrix direction. Each pixel PX may have a rectangular or square shape in a plan view. In an embodiment, each pixel PX may include multiple light emitting elements made of inorganic particles, but the disclosure is not limited thereto.

Each of the pixels PX may include a light emission area LA defined by a pixel defining layer or a bank and a light blocking area BA around the light emission area LA.

The light emission area LA may be an area in which light generated from a light emitting element of the display device 10 to be described later may be provided to the outside of the display device 10, and the light blocking area BA may be an area in which light generated from the light emitting element of the display device 10 may not be provided to the outside of the display device 10.

The light emission area LA may include first to third light emission areas LA1, LA2, and LA3. The first to third light emission areas LA1, LA2, and LA3 may emit light having a predetermined peak wavelength to the outside of the display device 10. The first emission area LA1 may emit light of a first color, the second emission area LA2 may emit light of a second color, and the third emission area LA3 may emit light of a third color. For example, the light of the first color may be red light having a peak wavelength in the range of about 610 nm to about 650 nm, the light of the second color may be green light having a peak wavelength in the range of about 510 nm to about 550 nm, and the light of the third color may be blue light having a peak wavelength in the range of about 440 nm to about 480 nm, but the disclosure is not limited thereto.

The first to third light emission areas LA1, LA2, and LA3 may be repeatedly arranged sequentially along the first direction DR1 of the display area DA.

The light blocking area BA may be disposed to surround the light emission areas LA: LA1, LA2, and LA3. The light blocking area BA of each pixel PX may be in contact with the light blocking area BA of another pixel PX adjacent thereto. The light blocking areas BA of adjacent ones of the pixels PX may be connected to one structure (for example, being integral with each other). In other embodiments, the light blocking areas BA of all the pixels PX may be connected to one structure (for example, being integral with each other). However, the structure or formation of the light blocking area BA are not limited thereto. The light emission areas LA (LA1, LA2, and LA3) of each adjacent pixel PX may be divided by the light blocking area BA.

Figure 3:
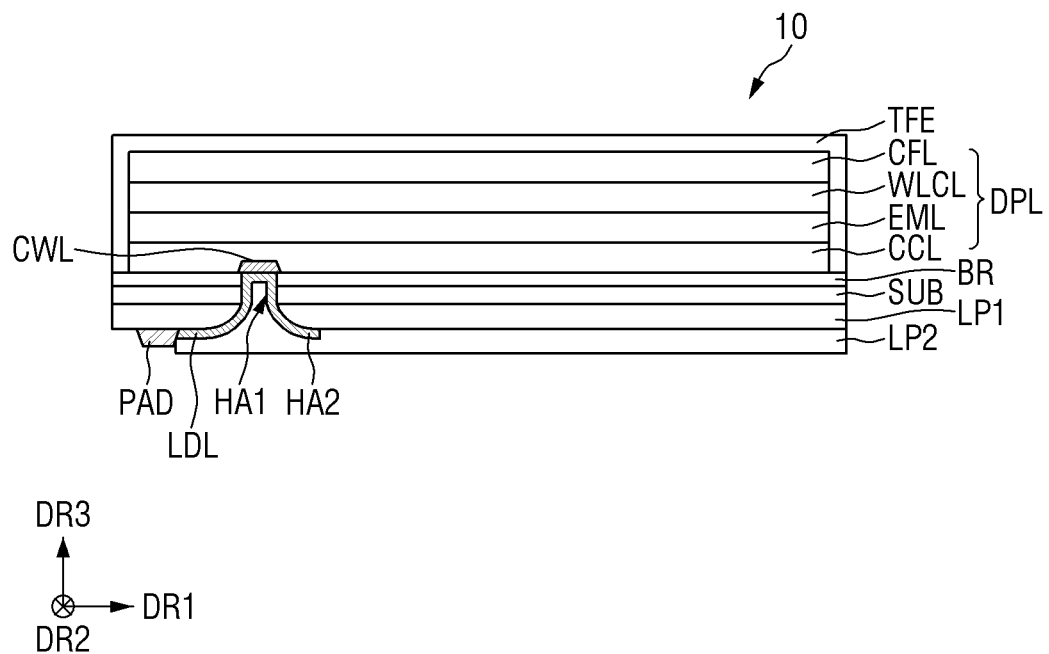
FIG. 3 is a schematic cross-sectional view of a display device according to an embodiment.

FIG. 3 is a schematic cross-sectional view of a display device according to an embodiment.

Referring to FIG. 3, the display device 10 according to an embodiment may include a base member SUB, a barrier layer BR, a display layer DPL, an encapsulation layer TFE, a first lower protective layer LP1 and a second lower protective layer LP2. The display device 10 may further include a pad portion PAD and a lead line LDL.

The base member SUB may support the display layer DPL. In the process of manufacturing the display device 10, which will be described later, the display layer DPL and the encapsulation layer TFE may be formed on a surface (or upper surface) of the base member SUB. In an embodiment, the base member SUB may include polyimide (PI).

The barrier layer BR may be disposed on a surface (upper surface in the drawings) of the base member SUB. The barrier layer BR may be disposed on a surface of the base member SUB to prevent penetration of moisture or air from the outside of the display device 10, thereby preventing the display layer DPL disposed on the barrier layer BR from being damaged.

The barrier layer BR may include an inorganic material. For example, the barrier layer BR may include at least one of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride.

The display layer DPL may be disposed on a surface of the barrier layer BR. The display layer DPL may include a circuit layer CCL, a light emitting element layer EML, a wavelength conversion layer WLCL, and a color filter layer CFL.

The circuit layer CCL may be disposed on a surface of the barrier layer BR. The circuit layer CCL may include at least one transistor or the like for driving pixels to drive the light emitting element layer EML.

The circuit layer CCL may include a connection wiring CWL. The connection wiring CWL may be exposed on the lower surface of the display layer DPL. The connection wiring CWL exposed on the lower surface of the display layer DPL may be electrically connected to the lead line LDL through a first hole HA1 penetrating the barrier layer BR and the base member SUB. The connection wiring CWL may supply an electric signal received from the pad portion PAD to the circuit layer CCL through the lead line LDL.

The light emitting element layer EML may be disposed on the circuit layer CCL. The light emitting element layer EML may include light emitting elements, and the light emitting elements may emit light according to an electric signal transmitted from the circuit layer CCL. The light emitted from the light emitting element may be incident on the wavelength conversion layer WLCL.

The wavelength conversion layer WLCL may be disposed on the light emitting element layer EML. The wavelength conversion layer WLCL may convert the wavelength of light or transmit the light such that the wavelength of light emitted from the light emitting element layer EML and incident on the wavelength conversion layer WLCL corresponds to a color corresponding to each pixel PX.

The color filter layer CFL may be disposed on the wavelength conversion layer WLCL. The color filter layer CFL may block the emission of light of a color other than the color corresponding to each pixel PX.

The encapsulation layer TFE may be disposed on the display layer DPL. The encapsulation layer TFE may overlap (e.g., cover) the upper and side surfaces of the display layer DPL. For example, the encapsulation layer TFE may include at least one inorganic layer to prevent penetration of oxygen or moisture. Further, the encapsulation layer TFE may include at least one organic layer to protect the display device 10 from foreign matter such as dust.

The first lower protective layer LP1 may be disposed on another surface (lower surface in the drawing) of the base member SUB. The lower surface may be opposite to a surface (e.g., the upper surface) of the base member SUB. The first lower protective layer LP1 may cover the lower surface of the base member SUB. The first lower protective layer LP1 may serve to protect the base member SUB and the display layer DPL from the outside. Further, in the etching process of forming the first hole HA1 penetrating the barrier layer BR and the base member SUB during the process of manufacturing the display device 10, the first lower protective layer LP1 may be used as an etching mask in order to omit an additional mask process for forming the first hole HA1. Details thereof will be described later.

The first lower protective layer LP1 may include a second hole HA2 penetrating the first lower protective layer LP1. The second hole HA2 may be located in an area corresponding to the first hole HA1 penetrating the barrier layer BR and the base member SUB in the third direction DR3. The second hole HA2 may be formed by printing a material included in the first lower protective layer LP1 only in an area excluding the area corresponding to the first hole HA1 in the printing process for forming the first lower protective layer LP1.

The pad portion PAD may be disposed on the lower surface of the first lower protective layer LP1. The pad portion PAD may be disposed on the lower surface of the first lower protective layer LP1, and may be electrically connected to the connection wiring CWL through the lead line LDL. The pad portion PAD may be disposed to be spaced apart from the connection wiring CWL on the lower surface of the first lower protective layer LP1 in a plan view. The pad portion PAD may receive various voltages or signals from a flexible film, and may supply these voltages or signals to the connection wiring CWL.

The lead line LDL may be disposed between the connection wiring CWL and the pad portion PAD, and may electrically connect the connection wiring CWL and the pad portion PAD. The lead line LDL may be electrically connected to the connection line CWL through the first hole HA1 penetrating the barrier layer BR and the base member SUB and the second hole HA2 penetrating the first lower protective layer LP1. Specifically, the lead line LDL may cover at least a part of a sidewall of the first hole HA1 and at least a part of a sidewall of the second hole HA2, and the lead line LDL may be electrically connected to the connection wiring CWL exposed through the first hole HA1 and the second hole HA2.

The second lower protective layer LP2 may be disposed on the lower surfaces of the lead line LDL and the first lower protective layer LP1. The second lower protective layer LP2 may cover the lead line LDL and the first lower protective layer LP1 thereunder. For example, the second lower protective layer LP2 may cover an area of the lower surface of the first lower protective layer LP1, the area being not provided with the pad portion PAD. The second lower protective layer LP2 may protect the lower surfaces of the lead line LDL and the display device 10. Further, the second lower protective layer LP2 may also serve to flatten a step caused by members disposed under the base member SUB.

Figure 4:
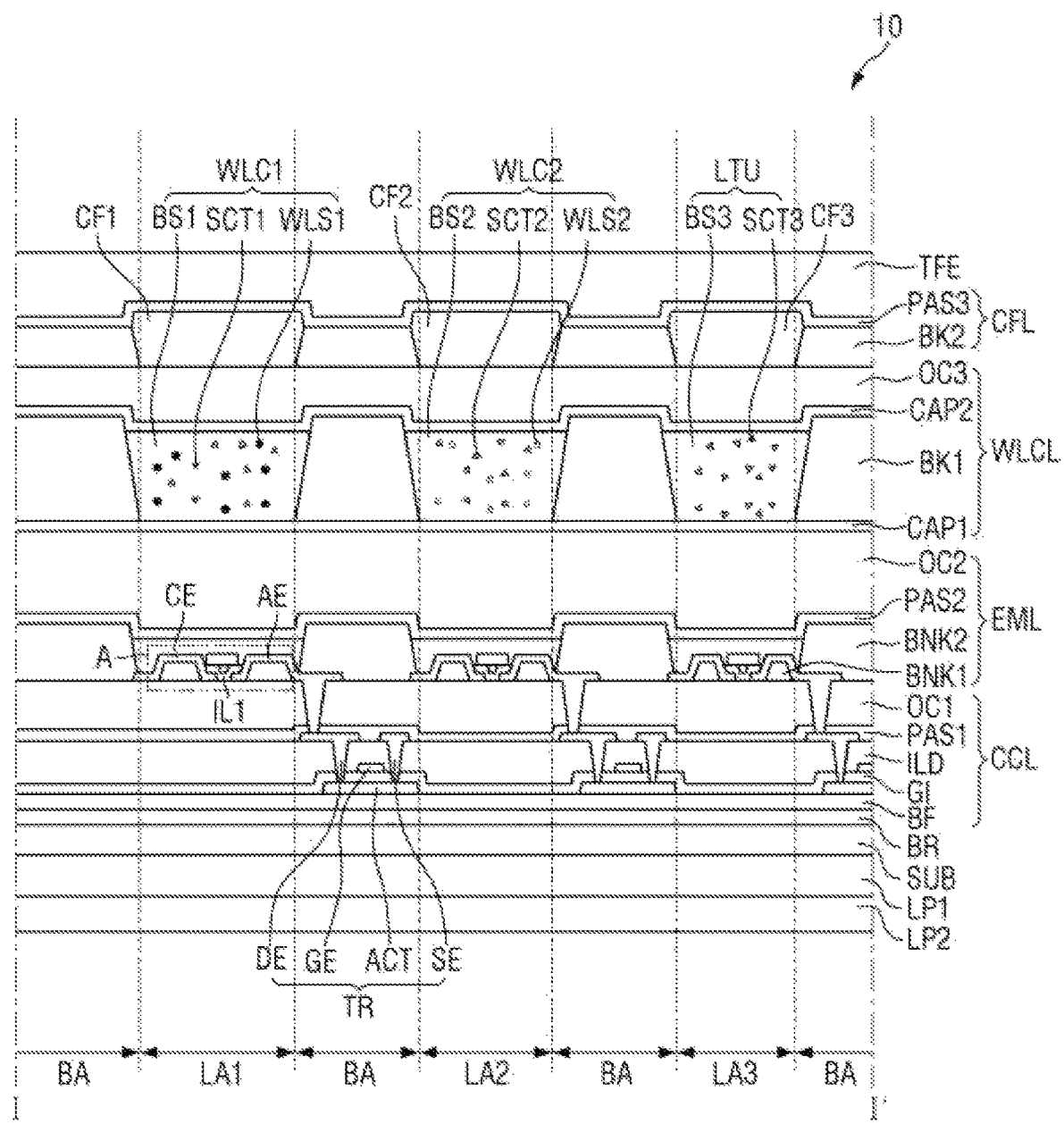
FIG. 4 is a schematic cross-sectional view taken along line I-I' of FIG. 2.

FIG. 4 is a schematic cross-sectional view taken along line I-I' of FIG. 2.

Hereinafter, a cross-sectional structure of multiple members disposed in the display area DA of the display device 10 according to an embodiment will be described in detail with reference to FIGS. 2 to 4.

Sequentially explaining the cross-sectional structure of the display device 10 in the upward direction (for example, the third direction DR3), the second lower protective layer LP2 may be disposed on the lower surface of the first lower protective layer LP1 to protect members disposed thereon and to flatten a step caused by members disposed under the base member SUB.

The second lower protective layer LP2 may include at least one of acrylic resin, epoxy resin, phenolic resin, polyamide resin, unsaturated polyester resin, polyphenylene ether resin, polyphenylene sulfide resin, and benzocyclobutene resin.

In an embodiment, the second lower protective layer LP2 may include the same material as the first lower protective layer LP1, but may have different stiffness and/or a different thermal expansion coefficient from the first lower protective layer LP1. However, the disclosure is not limited thereto, and the second lower protective layer LP2 may include the same material as the first lower protective layer LP1 to have the same characteristics, and may include a different material from the first lower protective layer LP1.

The first lower protective layer LP1 may be disposed on the upper surface of the second lower protective layer LP2 and the lower surface of the base member SUB. The first lower protective layer LP1 may protect members disposed thereon together with the second lower protective layer LP2. The first lower protective layer LP2 may completely cover the lower surface of the base member SUB. In an embodiment, the first lower protective layer LP1 may include a different material from the base member SUB.

Specifically, in the process of forming the first hole HA1 penetrating the barrier layer BR and the base member SUB during the process of manufacturing the display device 10, the first lower protective layer LP1 may include a material different from the material included in the base member SUB in order to be disposed on the lower surface of the base member SUB and used as an etching mask. For example, the first lower protective layer LP1 may include a material having different etching rates for the base member SUB and the first lower protective layer LP1 with respect to the same etchant. Specifically, in the etchant used in the process of etching the base member SUB to be described later, the etching rate for the base member SUB may be significantly greater than the etching rate for the first lower protective layer LP1. For example, the first lower protective layer LP1 and the base member SUB may have etching selectivities that are greatly different from each other with respect to the etchant used in the process of etching the base member SUB. Details thereof will be described later.

In an embodiment in which the base member SUB includes polyimide (PI) as described above, the first lower protective layer LP1 may include acrylic resin. However, the disclosure is not limited thereto, and the material included in the first lower protective layer LP1 is not particularly limited within the range where the material has a large difference in etching selectivity from the base member SUB and functions as a protective layer capable of protecting the display layer DPL from the outside.

The base member SUB may be disposed on the first lower protective layer LP1. The base member SUB may support the display layer DPL. As described above, the base member SUB may include polyimide (PI).

The barrier layer BR may be disposed on the base member SUB. The barrier layer BR may include an inorganic material capable of preventing penetration of air or moisture and may be disposed between the base member SUB and the display layer DPL, thereby protecting the lower portion of the display layer DPL.

The circuit layer CCL may be disposed on the barrier layer BR.

The circuit layer CCL may include a buffer layer BF, a transistor TR, a gate insulating layer GI, an interlayer insulating layer ILD, a first passivation layer PAS1, and a first planarization layer OC1.

The buffer layer BF may be disposed on the barrier layer BR. The buffer layer BF may include an inorganic material capable of preventing penetration of air or moisture. For example, the buffer layer BF may include inorganic layers alternately stacked.

The transistor TR may be disposed on the buffer layer BF, and may constitute a pixel circuit of each of the pixels. For example, the transistor TR may be a driving transistor or a switching transistor of a pixel circuit. The transistor TR may include a semiconductor layer ACT, a gate electrode GE, a source electrode SE, and a drain electrode DE.

The semiconductor layer ACT may be disposed on the buffer layer BF. The semiconductor layer ACT may overlap the gate electrode GE in the third direction DR3 (or the thickness direction of the display device 10 under the gate electrode GE, and may be insulated from the gate electrode GE by the gate insulating layer GI.

The gate insulating layer GI may be disposed on the semiconductor layer ACT. For example, the gate insulating layer GI may cover the semiconductor layer ACT and the buffer layer BF exposed by the semiconductor layer ACT, and may insulate the semiconductor layer ACT and the gate electrode GE. The gate insulating layer GI may include a contact hole penetrating each of the source electrode SE and the drain electrode DE.

The gate electrode GE may be disposed on the gate insulating layer GI. The gate electrode GE may be disposed to overlap the semiconductor layer ACT disposed thereunder in the third direction DR3.

The interlayer insulating layer ILD may be disposed on the gate electrode GE. For example, the interlayer insulating layer ILD may include a contact hole penetrating the source electrode SE and the drain electrode DE. The contact hole of the interlayer insulating layer ILD may overlap the contact hole of the gate insulating layer GI in the third direction DR3 and may be connected to the contact hole of the gate insulating layer GI.

The source electrode SE and the drain electrode DE may be disposed to be spaced apart from each other on the interlayer insulating layer ILD. Although not shown in the drawing, the source electrode SE may be connected to a data line or a driving voltage line. The source electrode SE may be connected to the semiconductor layer ACT through a contact hole penetrating the gate insulating layer GI and the interlayer insulating layer ILD. The drain electrode DE may be electrically connected to the first electrode AE of the light emitting element layer E L. The drain electrode DE may be connected to the semiconductor layer ACT through a contact hole penetrating the gate insulating layer GI and the interlayer insulating layer ILD.

The first passivation layer PAS1 may be disposed on the source electrode SE and the drain electrode DE. The first passivation layer PAS1 may be disposed on the transistor TR to protect the transistor TR. The first passivation layer PAS1 may include a contact hole penetrated by the first electrode AE of the light emitting element layer EML.

The first planarization layer OCl may be disposed on the first passivation layer PAS1. The first planarization layer OCl may be disposed on the first passivation layer PAS1 and may serve to flatten a step caused by layers disposed thereunder. The first planarization layer OC1 may include a contact hole penetrated by first electrode AE of the light emitting element layer EML The first planarization layer OC1 may include an organic material.

The light emitting element layer EML may include a light emitting element ED (see FIG. 6, which shows a region of FIG. 4), a first electrode AE, a second electrode CE, a first bank BNK1, a second bank BNK2, a second passivation layer PAS2, and a second planarization layer OC2.

The second bank BNK2 may be disposed on the first planarization layer OCl of the circuit layer CCL, and may be disposed along the boundary of each pixel PX. The second bank BNK2 may be disposed in the light blocking area BA. The second bank BNK2 may include an opening for exposing the first bank BNK1 and the light emitting elements ED. The first to third light emission areas LA1, LA2, and LA3 and the light blocking area BA may be divided by the second bank BNK2 and its opening. For example, the second bank BNK2 may define the light emission area LA and light blocking area BA of the display device 10.

The first bank BNK1 and the light emitting elements ED may be disposed in the opening divided by the second bank BNK2.

The first bank BNK1 may be disposed on the first planarization layer OC1. Multiple first banks BNK1 may be provided, and may be disposed in the opening divided by the second bank BNK2 to be spaced apart from each other. The first bank BNK1 may be disposed to overlap one of the first to third light emission areas LA1, LA2, and LA3 defined by the second bank BNK2.

The first electrode AE may be disposed on the first planarization layer OC1. The first electrode AE may be disposed on the first bank BNK1 to cover the first bank BNK1. The first electrode AE may be electrically connected to the drain electrode DE of the transistor TR through a contact hole penetrating the first planarization layer OC1 and the first passivation layer PAS1. The first electrode AE may be connected to the drain electrode DE of the transistor TR to receive a driving current.

The second electrode CE may be disposed on the first planarization layer OCl. The second electrode CE may be disposed on the first bank BNK1 to cover the first bank BNK1. The second electrode CE may receive a common voltage supplied to all pixels.

The first insulating layer IL1 may be disposed on the first electrode AE and the second electrode CE. The first insulating layer IL1 may be disposed between the first electrode AE and the second electrode CE to electrically insulate the first electrode AE and the second electrode CE.

The light emitting element ED may be disposed on the first insulating layer IL1 so that both ends thereof are disposed on the first electrode AE and the second electrode CE, respectively. An end of the light emitting element ED may be electrically connected to the first electrode AE, and another end of the light emitting element ED may be electrically connected to the second electrode CE.

The light emitting elements ED may include an active layer having the same material, and may emit light of the same wavelength band or light of the same color. The light emitted from each of the first to third light emission areas may have the same color. For example, the light emitting elements ED may emit light of a third color or blue light having a peak wavelength in the range of about 440 nm to about 480 nm. Accordingly, the light emitting element layer EIL may emit light of a third color or blue light.

The second passivation layer PAS2 may be disposed on the second bank BNK2. The second passivation layer PAS2 may be disposed on the light emitting elements ED to protect the light emitting elements ED. The second passivation layer PAS2 may prevent penetration of impurities such as moisture or air from the outside to prevent damage to the light emitting elements ED.

The second planarization layer OC2 may be disposed on the second passivation layer PAS2. The second planarization layer OC2 may be disposed below and may serve to flatten a step difference caused by multiple members. For example, the second planarization layer OC2 may include an organic material.

The wavelength conversion layer WLCL may be disposed on the second planarization layer OC2. The wavelength conversion layer WLCL may include a first capping layer CAP1, a first light blocking member BK1, a first wavelength conversion pattern WLC1, a second wavelength conversion pattern WLC2, a light transmission pattern LTU, a second capping layer CAP2, and a third planarization layer OC3.

The first capping layer CAP1 may be disposed on the second planarization layer OC2 of the light emitting element layer EML. The first capping layer CAPi may encapsulate the lower surfaces of the first and second wavelength conversion patterns WLC1 and WLC2 and the light transmission pattern LTU. For example, the first capping layer CAP1 may include an inorganic material.

The first light blocking member BK1 may be disposed in the light blocking area BA on the first capping layer CAP1. The first light blocking member BK1 may overlap the second bank BNK2 in the thickness direction. The first light blocking member BK1 may block the transmission of light. The first light blocking member BK1 prevents light from invading between the first to third light emission areas LA1, LA2, and LA3 and mixing colors, thereby improving the color reproducibility of the display device 10. The first light blocking member BK1 may be disposed in a lattice shape surrounding the first to third light emission areas LA1, LA2, and LA3 in a plan view.

The first light blocking member BK1 may include an organic light blocking material and a liquid repellent component. For example, the first light blocking member BK1 may be made of a black organic material including a liquid repellent component. The first light blocking member BK1 may be formed through coating and exposure processes of an organic light blocking material including a liquid repellent component.

The first wavelength conversion pattern WLC1 may be disposed in the first light emission area LA1 on the first capping layer CAP1. The first wavelength conversion pattern WLC1 may be surrounded by the first light blocking member BK1. The first wavelength conversion pattern WLC1 may include a first base resin BS1, a first scatterer SCT1, and a first wavelength conversion material WLS1.

The first base resin BS1 may include a material having relatively high light transmittance. The first base resin BS1 may be made of a transparent organic material. For example, the first base resin BS1 may include at least one of organic materials such as an epoxy resin, an acrylic resin, a cardo resin, and an imide resin.

The first scatterer SCT1 may have a refractive index different from that of the first base resin BS1, and may form an optical interface with the first base resin BS1. For example, the first scatterer SCT1 may include a light scattering material or light scattering particles that scatter at least a part of the transmitted light. For example, the first scatterer SCT1 may include a metal oxide such as titanium oxide ($TiO_2$), zirconium oxide ($ZrO_2$), aluminum oxide ($Al_2O_3$), indium oxide ($In_2O_3$), zinc oxide (ZnO), or tin oxide ($SnO_2$), or a combination thereof, or may include organic particles such as acrylic resin particles or urethane resin particles, or a combination thereof. The first scatterer SCT1 may scatter light in a random direction regardless of the incident direction of incident light without substantially converting the peak wavelength of the incident light.

The first wavelength conversion material WLS1 may convert or shift the peak wavelength of incident light to a first peak wavelength. For example, the first wavelength conversion material WLS1 may convert blue light provided from the display device 10 into red light having a single peak wavelength in the range of about 610 nm to about 650 nm and emit the red light. The first wavelength conversion material WLS1 may be a quantum dot, a quantum rod, or a phosphor. The quantum dot may be particulate matter that emits light of a specific color while electrons transition from a conduction band to a valence band.

A part of the blue light provided from the light emitting element layer EML may transmit the first wavelength conversion material WLS1 without being converted into red light by the first wavelength conversion material WLS1. In the blue light provided from the light emitting element layer EML, light that may not be converted by the first wavelength conversion material WLS1 and incident on the first color filter CF1 to be described later may be blocked by the first color filter CF1. Further, in the blue light provided from the light emitting element layer EML, the red light converted by the first wavelength conversion pattern WLC1 may transmit the first color filter CF1 and be emitted to the outside. Accordingly, the first light exit area LA1 may emit red light.

The second wavelength conversion pattern WLC2 may be disposed in the second light emission area LA2 on the first capping layer CAP1. The second wavelength conversion pattern WLC2 may be surrounded by the first light blocking member BK1. The second wavelength conversion pattern WLC2 may include a second base resin BS2, a second scatterer SCT2, and a second wavelength conversion material WLS2.

The second base resin BS2 may include a material having relatively high light transmittance. The second base resin BS2 may be made of a transparent organic material. For example, the second base resin BS2 may be made of the same material as the first base resin BS1, or may be made of the material exemplified in the first base resin BS1.

The second scatterer SCT2 may have a refractive index different from that of the second base resin BS2, and may form an optical interface with the second base resin BS2. For example, the second scatterer SCT2 may include a light scattering material or light scattering particles that scatter at least a part of the transmitted light. For example, the second scatterer SCT2 may be made of the same material as the first scatterer SCT1, or may be made of the material exemplified in the first scatterer SCT1. The second scatterer SCT2 may scatter light in a random direction regardless of the incident direction of incident light without substantially converting the peak wavelength of the incident light.

The second wavelength conversion material WLS2 may convert or shift the peak wavelength of incident light to a second peak wavelength different from the first peak wavelength of the first wavelength conversion material WLS1. For example, the second wavelength conversion material WLS2 may convert blue light provided from the display device 10 into green light having a single peak wavelength in the range of about 510 nm to about 550 nm and emit the green light. The second wavelength conversion material WLS2 may be made of a quantum dot, a quantum rod, or a phosphor such that the wavelength conversion range of the second wavelength conversion material WLS2 may be different from the wavelength conversion range of the first wavelength conversion material WLS1.

The light transmission pattern LTU may be disposed in the third light emission area LA3 on the first capping layer CAP1. The light transmission pattern LTU may be surrounded by the first light blocking member BK1. The light transmission pattern LTU may transmit incident light while maintaining the peak wavelength thereof. The transmission pattern LTU may include a third base resin BS3 and a third scatterer SCT3.

The third base resin BS3 may include a material having relatively high light transmittance. The third base resin BS3 may be made of a transparent organic material. For example, the third base resin BS3 may be made of the same material as the first or second base resin BS1 or BS2, or may be made of the material exemplified in the first or second base resin BS1 or BS2.

The third scatterer SCT3 may have a refractive index different from that of the third base resin BS3, and may form an optical interface with the third base resin BS3. For example, the third scatterer SCT3 may include a light scattering material or light scattering particles that scatter at least a part of transmitted light. For example, the third scatterer SCT3 may be made of the same material as the first or second scatterer SCT1 or SCT2, or may be made of the material exemplified in the first or second scatterer SCT1 or SCT2. The third scatterer SCT3 may scatter light in a random direction regardless of the incident direction of incident light without substantially converting the peak wavelength of the incident light.

The wavelength conversion layer WLCL may be disposed on (e.g., directly disposed on) the second planarization layer OC2 of the light emitting element layer EML, so that the display device 10 may not require a separate substrate or base member for the first and second wavelength conversion patterns WLC1 and WLC2 and the light transmission pattern LTU. Accordingly, the first and second wavelength conversion patterns WLC1 and WLC2 and the light transmission pattern LTU may be easily aligned with each of the first to third light emission areas LA1, LA2, and LA3, and the thickness of the display device 10 may be relatively reduced.

The second capping layer CAP2 may cover the first and second wavelength conversion patterns WLC1 and WLC2, the light transmission pattern LTU, and the first light blocking member BK1. For example, the second capping layer CAP2 may encapsulate the first and second wavelength conversion patterns WLC1 and WLC2 and the light transmission pattern LTU to prevent damage or contamination of the first and second wavelength conversion patterns WLC1 and WLC2 and the light transmission pattern LTU. For example, the second capping layer CAP2 may include an inorganic material.

The third planarization layer OC3 may be disposed on the second capping layer CAP2 to flatten the upper ends of the first and second wavelength conversion patterns WLC1 and WLC2 and the light transmission pattern LTU. For example, the third planarization layer OC3 may include an organic material.

The color filter layer CFL may be disposed on the third planarization layer OC3 of the wavelength conversion layer WLCL. The color filter layer CFL may include a second light blocking member BK2, first to third color filters CF1, CF2, and CF3, and a third passivation layer PAS3.

The second light blocking member BK2 may be disposed in the light blocking area BA on the third planarization layer OC3. The second light blocking member BK2 may overlap the first light blocking member BK1 or the second bank BNK2 in the thickness direction. The second light blocking member BK2 may block the transmission of light. The second light blocking member BK2 may prevent light from invading between the first to third light emission areas LA1, LA2, and LA3 and mixing colors, thereby improving the color reproducibility of the display device 10. The second light blocking member BK2 may be disposed in a lattice shape surrounding the first to third light emission areas LA1, LA2, and LA3 in a plan view.

The first color filter CF1 may be disposed in the first light emission area LA1 on the third planarization layer OC3. The first color filter CF1 may be surrounded by the second light blocking member BK2. The first color filter CF1 may overlap the first wavelength conversion pattern WLC1 in the thickness direction. The first color filter CF1 may selectively transmit light of a first color (for example, red light), and may block or absorb light of a second color (for example, green light) and light of a third color (for example, blue light). For example, the first color filter CF1 may be a red color filter, and may include a red colorant.

The second color filter CF2 may be disposed in the second light emission area LA2 on the third planarization layer OC3. The second color filter CF2 may be surrounded by the second light blocking member BK2. The second color filter CF2 may overlap the second wavelength conversion pattern WLC2 in the thickness direction. The second color filter CF2 may selectively transmit light of a second color (for example, green light), and may block or absorb light of a first color (for example, red light) and light of a third color (for example, blue light). For example, the second color filter CF2 may be a green color filter, and may include a green colorant.

The third color filter CF3 may be disposed in the third light emission area LA3 on the third planarization layer OC3. The third color filter CF3 may be surrounded by the second light blocking member BK2. The third color filter CF3 may overlap the light transmission pattern LTU in the thickness direction. The third color filter CF3 may selectively transmit light of a third color (for example, blue light), and may block or absorb light of a first color (for example, red light) and light of a second color (for example, green light). For example, the third color filter CF3 may be a blue color filter, and may include a blue colorant.

The first to third color filters CF1, CF2, and CF3 may absorb a part of light provided from the outside of the display device 10 to reduce reflected light caused by external light. Accordingly, the first to third color filters CF1, CF2, and CF3 may prevent color distortion due to reflection of external light.

The first to third color filters CF1, CF2, and CF3 may be disposed on (e.g., directly disposed on) the third planarization layer OC3 of the wavelength conversion layer WLCL, so that the display device 10 may not require a separate substrate or base member for the first to third color filters CF1, CF2, and CF3. Accordingly, the thickness of the display device 10 may be relatively reduced.

The third passivation layer PAS3 may cover the first to third color filters CF1, CF2, and CF3. The third passivation layer PAS3 may protect the first to third color filters CF1, CF2, and CF3.

The encapsulation layer TFE may be disposed on the third passivation layer PAS3 of the color filter layer CFL. The encapsulation layer TFE may cover the upper and side surfaces of the display layer DPL. For example, the encapsulation layer TFE may include at least one inorganic layer to prevent penetration of oxygen or moisture. Further, the encapsulation layer TFE may include at least one organic layer to protect the display device 10 from foreign matter such as dust.

Figure 5:
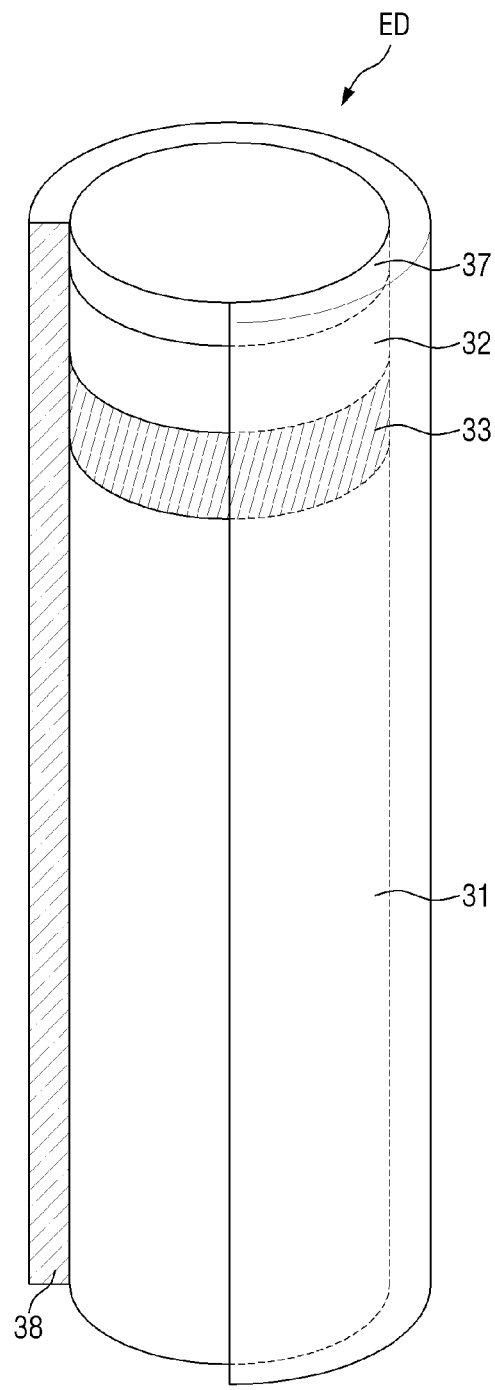
FIG. 5 is a schematic perspective view of a light emitting element according to an embodiment.

FIG. 5 is a schematic perspective view of a light emitting element according to an embodiment.

Referring to FIG. 5, the light emitting element ED may be a particulate element, and may have a rod shape or a cylindrical shape having a predetermined aspect ratio. The length of the light emitting element ED may be larger than the diameter of the light emitting element ED, and the aspect ratio thereof may be about 1.2:1 to about 100:1, but is not limited thereto.

The light emitting element ED may have a size of a nano-meter scale (about 1 nm or more and less than about 1 μm) to a micrometer scale (about 1 μm or more and less than about 1 mm). In an embodiment, both diameter and length of the light emitting element ED may have a size of a nanometer scale, or may have a size of a micrometer scale. In some embodiments, the diameter of the light emitting element ED may have a size of a nanometer scale, while the length of the light emitting element ED may have a size of a micrometer scale. In some embodiments, some of the light emitting elements ED may have a size of a nanometer scale in diameter and/or length, while others of the light emitting elements ED may have a size of a micrometer scale in diameter and/or length.

The light emitting element ED may include an inorganic light emitting diode. The inorganic light emitting diode may include semiconductor layers. For example, the inorganic light emitting diode may include a first conductive (for example, n-type) semiconductor layer, a second conductive (for example, p-type) semiconductor layer, and an active semiconductor layer interposed therebetween. The active semiconductor layer may receive holes and electrons from the first conductivity-type semiconductor layer and the second conductivity-type semiconductor layer, respectively, and the holes and electrons having reached the active semiconductor layer may be combined with each other to emit light.

In an embodiment, the above-described semiconductor layers may be sequentially stacked along the length direction of the light emitting element ED. As shown in FIG. 5, the light emitting element ED may include a first semiconductor layer 31, an active layer 33, and a second semiconductor layer 32, which are sequentially stacked in the length direction. The first semiconductor layer 31, the active layer 33, and the second semiconductor layer 32 may be the above-described first conductive semiconductor layer, active semiconductor layer, and second conductive semiconductor layer, respectively.

The first semiconductor layer 31 may be doped with a first conductive dopant. The first conductive dopant may be Si, Ge, Sn, or the like. In an embodiment, the first semiconductor layer 31 may be n-GaN doped with n-type Si.

The second semiconductor layer 32 may be disposed to be spaced apart from the first semiconductor layer 31 with the active layer 33 interposed therebetween. The second semiconductor layer 32 may be doped with a second conductive dopant such as Mg, Zn, Ca, Se, or Ba. In an embodiment, the second semiconductor layer 32 may be p-GaN doped with p-type Mg.

The active layer 33 may include a material having a single or multiple quantum well structure. As described above, the active layer 33 may emit light by combination of an electron-hole pair according to an electric signal applied through the first semiconductor layer 31 and the second semiconductor layer 32.

In some embodiments, the active layer 33 may have a structure in which semiconductor materials having high band gap energy and semiconductor materials having low band gap energy are alternately stacked with each other, and may include other Group 3 to Group 5 semiconductor materials depending on the wavelength band of emitted light.

Light emitted from the active layer 33 may be emitted not only to the outer surface of the light emitting element ED in the longitudinal direction, but also to both side surfaces thereof. For example, the direction of light emitted from the active layer 33 is not limited to one direction.

The light emitting element ED may further include an electrode layer 37 disposed on the second semiconductor layer 32. The electrode layer 37 may be in contact with the second semiconductor layer 32. The electrode layer 37 may be an ohmic contact electrode, but is not limited thereto, and may be a Schottky contact electrode.

In case that both ends of the light emitting element ED may be electrically connected to the contact electrodes CTE1 and CTE2 so as to apply electric signals to the first and second semiconductor layers 31 and 32, the electrode layer 37 may be disposed between the second semiconductor layer 32 and the contact electrodes CTE1 and CTE2 to reduce resistance. The electrode layer 37 may include at least one of aluminum (Al), titanium (Ti), indium (In), gold (Au), silver (Ag), indium tin oxide (ITO), indium zinc oxide (IZO), and indium tin-zinc oxide (ITZO). The electrode layer 37 may include a semiconductor material doped with an n-type or p-type dopant.

The light emitting element ED may further include an insulating layer 38 surrounding the outer peripheral surfaces of the first semiconductor layer 31, the second semiconductor layer 32, the active layer 33 and/or the electrode layer 37. The insulating layer 38 may be disposed to surround at least an outer surface of the active layer 33 and may extend in a direction in which the light emitting element ED extends. The insulating layer 38 may perform a function of protecting the members. The insulating layer 38 may be made of a material having insulating properties, and may prevent an electric short that may occur in case that the active layer 33 is in direct contact with an electrode through which an electric signal may be transmitted to the light emitting element ED. Further, since the insulating film 38 may protect the outer peripheral surfaces of the first and second semiconductor layers 31 and 32 and the active layer 33, it may be possible to prevent a decrease in light emission efficiency.

Figure 6:
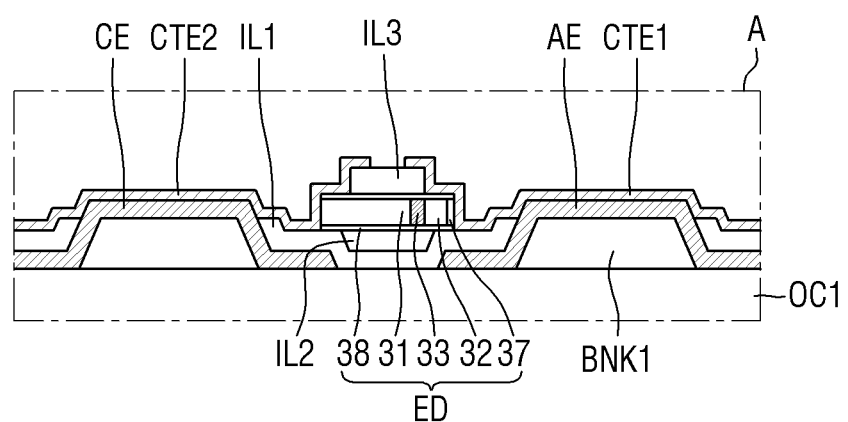
FIG. 6 is an enlarged schematic view of area A of FIG. 4.

FIG. 6 is an enlarged schematic view of area A of FIG. 4.

Hereinafter, a cross-sectional structure of the light emitting element layer EML will be described with reference to FIGS. 4 to 6. The light emitting element layer EML may be disposed on the first planarization layer OC1 of the circuit layer CCL.

The light emitting element layer EIL according to an embodiment may include a first bank BNK1, a second bank BNK2, a light emitting element ED, a first electrode AE, a second electrode CE, a first contact electrode CTE1, a second contact electrode CTE2, first to third insulating layers IL1, IL2, and IL3, a second passivation layer PAS2, and a second planarization layer OC2.

The first banks BNK1 may be disposed in each of the first to third light emission areas LA1, LA2, and LA3. The first banks BNK1 may be disposed on the first planarization layer OC1, and side surfaces of each of the first banks BNK1 may be inclined from the first planarization layer OC1. The first bank BNK1 may include polyimide (PI), but is not limited thereto.

Each of the first and second electrodes AE and CE may be disposed on the corresponding first bank BNK1. The first and second electrodes AE and CE may be electrically connected to the light emitting devices ED, respectively, and a predetermined voltage may be applied to allow the light emitting element ED to emit light. For example, the first and second electrodes AE and CE may be electrically connected to the light emitting element ED disposed between the first banks BNK1 through first and second contact electrodes CTE1 and CTE2 to be described later, respectively, and electric signals applied to the first and second electrodes AE and CE may be transmitted to the light emitting element ED through the first and second contact electrodes CTE1 and CTE2.

The first and second electrodes AE and CE may include a transparent conductive material. For example, each of the first and second electrodes AE and CE may include at least one of indium tin oxide (ITO), indium zinc oxide (IZO), and indium tin-zinc oxide (ITZO), but the material thereof is not limited thereto.

The first and second electrodes AE and CE may include a conductive material having high reflectivity. For example, the first and second electrodes AE and CE may include at least one metal such as silver (Ag), copper (Cu), aluminum (Al), which may have high reflectivity. The first and second electrodes AE and CE may reflect light incident from the light emitting element ED toward the upper portion of the display device 10.

The first insulating layer IL1 may be disposed on the first planarization layer OC1, the first electrode AE, and the second electrode CE. The first insulating layer IL1 may cover a part of each of the first and second electrodes AE and CE. For example, the first insulating layer IL1 may include an opening for exposing parts of the first and second electrodes AE and CE corresponding to the upper surface of the first bank BNK1. The first insulating layer IL1 may protect the first and second electrodes AE and CE, and may insulate the first and second electrodes AE and CE from each other. The first insulating layer IL1 may prevent the light emitting diode ED from being damaged by direct contact with other members.

For example, the first insulating layer IL1 may include an inorganic insulating material, and may include a step recessed between the first and second electrodes AE and CE. The second insulating layer IL2 may fill the recessed step of the first insulating layer IL1. Accordingly, the second insulating layer IL2 may flatten the upper surface of the first insulating layer IL1, and the light emitting element ED may be disposed on the first and second insulating layers IL1 and IL2 such that both ends thereof are placed on the first electrode AE and the second electrode CE, respectively.

The light emitting element ED may be disposed between the first banks BNK1 such that both ends thereof are placed on the first electrode AE and the second electrode CE, respectively, on the first and second insulating layers IL1 and IL2. The light emitting element ED may be electrically connected to the first electrode AE through the first contact electrode CTE1, and may be electrically connected to the second electrode CE through the second contact electrode CTE2.

As described above, the light emitting element ED may include semiconductor layers 31 and 32 doped with different conductive dopants. The light emitting element ED may include semiconductor layers 31 and 32, and may be aligned such that an end of the light emitting element ED faces a specific direction according to the direction of an electric field generated on the first and second electrodes AE and CE. Specifically, the light emitting element ED may have a shape extending in one direction, and both ends of the light emitting element ED in the extending direction are disposed on the first electrode AE and the second electrode CE, respectively.

The light emitting element ED may be disposed such that an extending direction thereof may be parallel to the base member SUB, and the semiconductor layers included in the light emitting element ED may be sequentially disposed along a direction parallel to the upper surface of the base member SUB. Specifically, in a cross-section across both ends of the light emitting element ED, the first semiconductor layer 31, the active layer 33, the second semiconductor layer 32, and the electrode layer 37 may be sequentially formed in a direction horizontal to one surface of the base member SUB. The light emitting element ED may be aligned such that an end thereof where the second semiconductor layer 32 may be located may be placed on the first electrode AE, and another end thereof where the first semiconductor layer 31 may be located may be placed on the second electrode CE. However, the disclosure is not limited thereto, and in some light emitting elements ED, an end thereof where the second semiconductor layer 32 may be located may be placed on the second electrode CE, and another end thereof where the first semiconductor layer 31 may be located may be placed on the first electrode AE.

The third insulating layer IL3 may be partially disposed on the light emitting element ED. The third insulating layer IL3 may be disposed to partially cover the outer surface of the light emitting element ED, but not cover both ends of the light emitting element ED. The third insulating layer IL3 may serve to protect the light emitting element ED and to fix the light emitting element ED in the process of manufacturing the display device 10.

The first contact electrode CTE1 may be disposed on the first electrode AE. The first contact electrode CTE1 may contact the first electrode AE and an end of the light emitting element ED, respectively. The first contact electrode CTE1 may electrically connect the light emitting element ED and the first electrode AE.

The second contact electrode CTE2 may be disposed on the second electrode CE. The second contact electrode CTE2 may contact the second electrode CE and another end of the light emitting element ED, respectively. The second contact electrode CTE2 may electrically connect the light emitting element ED and the second electrode CE.

Specifically, an end of the light emitting element ED where the second semiconductor layer 32 may be located may be electrically connected to the first electrode AE through the first contact electrode CTE1, and another end of the light emitting element ED where the first semiconductor layer 31 may be located may be electrically connected to the second electrode CE through the second contact electrode CTE2. For example, since both ends of the light emitting element ED are in contact with the first contact electrode CTE1 and the second contact electrode CTE2, respectively, electric signals may be applied from the first and second electrodes AE and CE, and light may be emitted from the active layer 33 of the light emitting element ED according to the electric signals.

Each of the first and second contact electrodes CTE1 and CTE2 may include a conductive material. For example, each of the first and second contact electrodes CTE1 and CTE2 may include ITO, IZO, ITZO, aluminum (Al), or a combination thereof. As an example, each of the first and second contact electrodes CTE1 and CTE2 may include a transparent conductive material, but the material thereof is not limited thereto.

Figure 7:
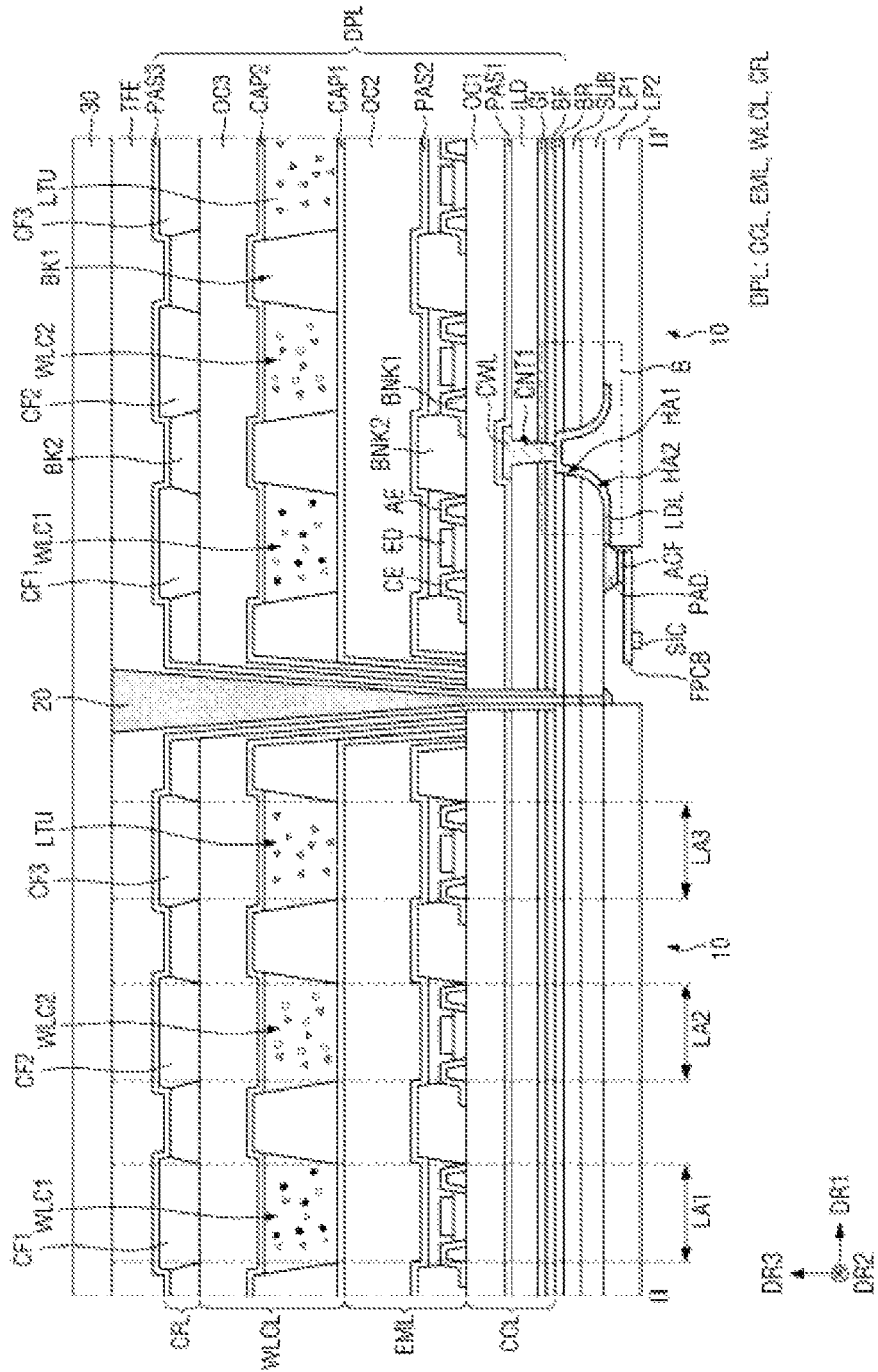
FIG. 7 is a schematic cross-sectional view taken along line II-II' of FIG. 2.
Figure 8:
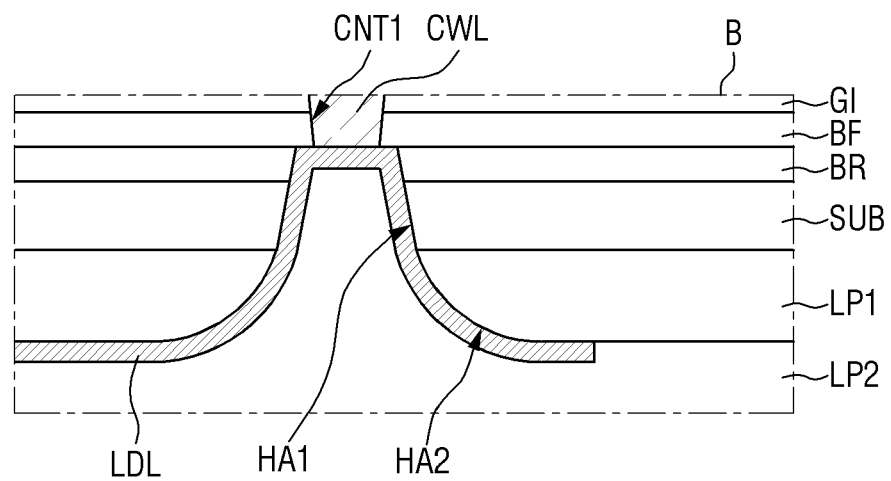
FIG. 8 is an enlarged schematic cross-sectional view of an example of area B of FIG. 7.
Figure 8:
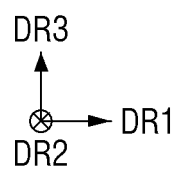

FIG. 7 is a schematic cross-sectional view taken along line II-II' of FIG. 2. FIG. 8 is an enlarged schematic cross-sectional view of an example of area B of FIG. 7.

Referring to FIGS. 2, 7, and 8, a tiled display device TD may include multiple display devices 10, a coupling member 20, and a cover member 30.

The display device 10 according to an embodiment may include a base member SUB, a barrier layer BR, a first lower protective layer LP1, a second lower protective layer LP2, a display layer DPL, an encapsulation layer TFE, a lead line LDL, a pad portion PAD, a flexible film FPCB, and a source driver SIC.

Hereinafter, a description of the display layer DPL included in the display device 10 will be replaced with the above description, and a connection wiring CWL included in the display layer DPL of the display device 10 and a structure of the base member SUB, the barrier layer BR, the first lower protective layer LP1 the second lower protective layer LP2, the lead line LDL, the pad portion PAD, the flexible film FPCB, and the source driver SIC, which are arranged under the connection wiring CWL, will be described.

The base member SUB may serve to support the display layer DPL. The base member SUB may include an organic material. In an embodiment, the base member SUB may include polyimide (PI). For example, the base member SUB may be a polyimide substrate.

The base member SUB may include an opening penetrating the base member SUB. The opening penetrating the base member SUB may constitute a first hole HA1 to be described later. The first hole HA1 may overlap the connection wiring CWL included in the circuit layer CCL and exposed from the lower surface of the display layer DPL in the thickness direction.

The barrier layer BR may be disposed on the base member SUB. As described above, the barrier layer BR may include an inorganic material, and may serve to protect the display layer DPL disposed thereon. The barrier layer BR may include an opening penetrating the barrier layer BR. The opening penetrating the barrier layer BR may constitute a first hole HA1 to be described later.

The first hole HA1 may be formed of a sidewall of the opening of the base member SUB and a sidewall of the opening of the barrier layer BR. For example, the first hole HA1 may penetrate the base member SUB and the barrier layer BR. The first hole HA1 may expose at least a part of the connection wiring CWL exposed from the lower surface of the display layer DPL. The first hole HA1 penetrating the base member SUB and the barrier layer BR may be formed through an etching process.

The display layer DPL disposed on the barrier layer BR may include a connection wiring CWL. In an embodiment, the connection wiring CWL may be disposed on the interlayer insulating layer ILD. The connection wiring CWL may be exposed from the lower surface of the display layer DPL through the first contact hole CNT1 penetrating the interlayer insulating layer ILD, the gate insulating layer GI, and the buffer layer BF. The connection wiring CWL may be exposed from the lower surface of the buffer layer BF. The connection wiring CWL exposed from the lower surface of the buffer layer BF may be electrically connected to the lead line LDL through the first hole HA1, and may be electrically connected to the pad portion PAD through the lead line LDL. The connection wiring CWL may supply electric signals received from the pad portion PAD to the transistor TR included in the circuit layer CCL.

The connection wiring CWL may be connected to a data line to supply a data voltage. The connection wiring CWL may be electrically connected to the source electrode SE of the transistor TR through the data line. For example, the connection wiring CWL may be formed of the same material on the same layer as the source electrode SE and drain electrode DE of the circuit layer CCL, but the disclosure is not limited thereto.

As another example, the connection wiring CWL may be formed of the same material on the same layer as the gate electrode GE of the transistor TR. The connection wiring CWL may be connected to scan lines to supply scan signals.

The first lower protective layer LP1 may be disposed on the lower surface of the base member SUB. In an embodiment, the first lower protective layer LP1 may completely cover the lower surface of the base member SUB. The first lower protective layer LP1 may be disposed on the lower surface of the base member SUB, but may not be disposed on the side surface of the base member SUB constituting a sidewall of the first hole HA1.

The first lower protective layer LP1 may include a second hole HA2 penetrating the first lower protective layer LP1. The second hole HA2 may have a funnel shape having a wide lower area and a narrow upper area, but the shape thereof is not limited thereto. The second hole HA2 may overlap the first hole HA1 in the thickness direction. The second hole HA2 included in the first lower protective layer LP1 may be formed by performing patterning through a printing process or coating process using an organic material without performing a separate etching process.

The first lower protective layer LP1 including the second hole HA2 may be formed through a printing process or coating process using an organic material. Specifically, the first lower protective layer LP1 may be formed by applying an organic material having fluidity onto the lower surface of the base member SUB through an inkjet printing process, a spin coating process, or a slit coating process. In order to form the second hole HA2, the organic material having fluidity may have high viscosity to such a degree that it may be easily applied onto only a desired area without being detached from the lower surface of the base member SUB. The organic material having high viscosity may be stably placed on the lower surface of the base member SUB through an ultraviolet curing or thermal curing process of the organic material having fluidity. A small amount of organic material that has been detached from the lower surface of the base member SUB may be removed through a cutting process.

The first lower protective layer LP1 may be used as an etching mask in the etching process for forming the first hole HA1 penetrating the base member SUB and the barrier layer BR. Accordingly, the first lower protective layer LP1 may include a material different from the material included in the base member SUB. Specifically, the first lower protective layer LP1 may include a material whose etching rate for an etchant used in the etching process for forming the first hole HA1 may be significantly lower than that of the base member SUB. In an embodiment in which the base member SUB includes polyimide (PI), the first lower protective layer LP1 may include a material different from polyimide (PI) and having a low etching rate for the etchant for etching process.

The first lower protective layer LP1 may serve to protect the display layer DPL disposed on the base member SUB. Accordingly, the first lower protective layer LP1 may include a material capable of protecting the display layer DPL. In an embodiment in which the base member SUB may be a polyimide substrate, the first lower protective layer LP1 may include an acrylic resin capable of functioning as a protective layer having an etching selectivity different from that of polyimide.

The pad portion PAD may be disposed on the lower surface of the first lower protective layer LP1. The pad portion PAD may be disposed on the lower surface of the first lower protective layer LP1 to be spaced apart from the connection wiring CWL and the second hole HA2 in a plan view. The pad portion PAD may receive various voltages or signals from the flexible film FPCB, and may supply the corresponding voltages or signals to the connection wiring CWL.

The lead line LDL may be disposed between the connection wiring CWL and the pad portion PAD. The lead line LDL may be disposed in an area between the connection wiring CWL and the pad portion PAD to electrically connect the connection wiring CWL and the pad portion PAD. An end of the lead line LDL may be in contact with the connection wiring CWL exposed by the first and second holes HA1 and HA2, and another end of the lead line LDL may be in contact with the pad portion PAD.

The lead line LDL may be disposed on the lower surface of the first lower protective layer LP1 and on the sidewall of each of the first and second holes HA1 and HA2. For example, the lead line LDL may cover the side surface of the first lower protective layer LP1 forming the sidewall of the second hole HA2, the side surfaces of the barrier layer BR and base member SUB forming the side wall of the first hole HA1, and the lower surface of the first lower protective layer LP1. The lead line LDL may have a spider shape, but the shape thereof is not limited thereto. For example, the lead line LDL may be formed in a stacked structure (Ti/Cu) of aluminum and copper or a stacked structure (Ti/Al/Ti) of aluminum and titanium, but the structure thereof is not limited thereto.

The second lower protective layer LP2 may cover the lead line LDL and the lower surface of the first lower protective layer LP1.

The second lower protective layer LP2 may be disposed in an area of the lower surface of the first lower protective layer LP1 where the pad portion PAD may not be disposed, and may cover them from the lower side thereof. The second lower protective layer LP2 may also serve to flatten a step caused by members disposed thereon by filling an area partitioned by the first and second holes HA1 and HA2.

An adhesive film ACF may attach the flexible film FPCB to the pad portion PAD. One surface of the adhesive film ACF may be attached to the pad portion PAD, and the other surface of the adhesive film ACF may be attached to the flexible film FPCB. For example, the adhesive film ACF may cover the entire pad portion PAD, but the disclosure is not limited thereto.

The adhesive film ACF may include an anisotropic conductive film. In case that the adhesive film ACF includes an anisotropic conductive film, the adhesive film ACF may have conductivity in an area in which the pad portion PAD contacts the contact pad of the flexible film FPCB, and may electrically connect the flexible film FPCB to the pad portion PAD.

The flexible film FPCB may be disposed under the display layer DPL. An end of the flexible film FPCB may be connected to the pad portion PAD through the adhesive film ACF, and another end of the flexible film FPCB may be connected to a source circuit board (not shown) under the display layer DPL. The flexible film FPCB may transmit a signal from the source driver SIC to the circuit layer CCL. For example, the source driver SIC may be an integrated circuit (IC). The source driver SIC may convert digital video data into an analog data voltage based on a source control signal of the timing controller, and may supply the analog data voltage to the data line of the display area DA through the flexible film FPCB.

The coupling member 20 may be disposed in the boundary area SM of the tiled display device TD. The tiled display device TD may couple side surfaces of the adjacent display devices 10 to each other by using a coupling member 20 disposed between the display devices 10. The coupling member 20 may implement a tiled display device TD by connecting the side surfaces of the display devices 10 arranged in a lattice form to each other. The coupling member 20 may couple the side surfaces of the encapsulation layer TFE of each of the display devices 10 adjacent to each other.

For example, the coupling member 20 may be made of a relative thin adhesive or double-sided tape, thereby minimizing the gap between the display devices 10. As another example, the coupling member 20 may be made of a relative thin coupling frame, thereby minimizing the gap between the display devices 10. Accordingly, the tiled display device TD may prevent a user from recognizing the boundary area SM between the display devices 10.

The cover member 30 may be disposed on the display devices 10 and the coupling member 20 to cover the display devices 10 and the coupling member 20. For example, the cover member 30 may be disposed on the upper surface of the encapsulation layer TFE of each of the display devices 10. The cover member 30 may protect the upper surface of the tiled display device TD.

Hereinafter, the shape and/or arrangement relationship of the first hole HA1, the second hole HA2, the base member SUB, and the first lower protective layer LP1 will be described in detail with reference to FIG. 8.

The cross-sectional shape of the first hole HA1 may have a trapezoidal shape whose width decreases upward. For example, the first hole HA1 may have a shape having a wide lower area and a narrow upper area. As shown in the drawing, the shape of the first hole HA1 having a wide lower area and a narrow upper area may be formed in the etching process for forming the first hole HA1.

The cross-sectional shape of the second hole HA2 may have a funnel shape having a wide lower area and a narrow upper area. Unlike the cross-sectional shape of the first hole HA1, the second hole HA2 may have a substantially curved sidewall.

The sidewalls constituting the first and second holes HA1 and HA2 may have an inclination with respect to a plane including one surface of the base member SUB. In an embodiment, the inclination angle of the sidewall of the first hole HA1 with respect to one surface of the base member SUB may be greater than the inclination angle of the sidewall of the second hole HA2. The shapes of the first and second holes HA1 and HA2 may be formed through a process of forming the first hole HA1 and the second hole HA2. For example, as described above, the second hole HA2 may be formed during a process of applying and curing a material containing an acrylic resin in an area not overlapping the first hole HA1 to form the first lower protective layer LP1. The first hole HA1 may be formed during a process of etching the base member SUB and the barrier layer BR.

The first lower protective layer LP1 may completely cover the lower surface of the base member SUB. The side surface of the base member SUB constituting the first hole HA1 may be aligned with the side surface of the first lower protective layer LP1. This structure may be formed by etching the base member SUB to which the second hole HA2 of the first lower protective layer LP1 may be exposed without etching the base member SUB covered by the first lower protective layer LP1 in the etching process for forming the first hole HA1.

In the display device 10 according to an embodiment, the connection wiring CWL, which may transmit driving signals for driving the pixels of the circuit layer CCL, may be exposed from the lower surface of the display layer DPL, so that electric signals may be supplied through the lower surface of the display layer DPL. Accordingly, since the electric signals may be supplied through the connection wiring CWL exposed from the lower surface of the display layer DPL, the non-display area or bezel area of the display device 10 may be minimized. In order to connect the connection wiring CWL exposed from the lower surface of the display layer DPL to the pad portion PAD, an etching process of forming the first hole HA1 exposing the connection wiring CWL to the barrier layer BR and base member SUB disposed under the display layer DPL should be performed. The first lower protective layer LP1 included in the display device 10 according to an embodiment may protect the upper members from the lower surface of the base member SUB in the etching process of forming the first hole HA1, and may be used as an etching mask. Accordingly, processes of applying, exposing and developing a photoresist layer for forming a photoresist pattern for forming a separate etching mask generally used in the etching process of forming the first hole HA1, and an ashing process or stripping process for removing the photoresist pattern may be omitted. Further, since the first lower protective layer LP1 may be used as an etching mask and also serves as a lower protective layer, a separate process for forming the lower protective layer may be omitted. Accordingly, economic efficiency of the process of manufacturing the display device 10 may be improved.

Hereinafter, a process of manufacturing the display device 10 will be described. In the description of the process of manufacturing the display device 10, for the same configuration as previously described for the structure of the layers of the display device 10, redundant descriptions will be omitted or simplified, and a manufacturing process will be described.

FIGS. 9 to 19 are schematic process views illustrating a process of manufacturing the display device of FIG. 7.

Hereinafter, in the drawings explaining the process of manufacturing the display device 10, a fourth direction DR4, a fifth direction DR5, and a sixth direction DR6 are defined. The fourth direction DR4 and the fifth direction DR5 may be directions perpendicular to each other in one plane. The sixth direction DR6 may be a direction perpendicular to a plane where the fourth direction DR4 and the fifth direction DR5 are positioned. The sixth direction DR6 may be perpendicular to each of the fourth direction DR4 and the fifth direction DR5. Hereinafter, in an embodiment explaining the process of manufacturing the display device 10, the sixth direction DR6 may refer to a direction in which the display layer DPL may be disposed based on the base member SUB.

In embodiments explaining the process of manufacturing the display device 10, unless otherwise stated, the "upper" may refer to a side on which a display layer DPL may be disposed with respect to a base member SUB toward one side in the sixth direction DR6, and the "upper surface" may refer to a surface facing one side in the sixth direction DR6. Further, the "lower" may refer to the other side toward a direction opposite to the sixth direction DR6, and the "lower surface" may refer to a surface facing the other side in the sixth direction DR6.

Figure 9:
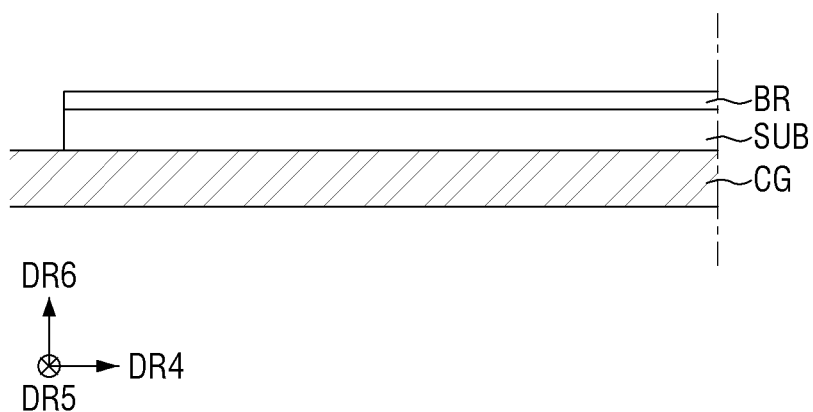
FIGS. 9 to 19 are schematic process views illustrating a process of manufacturing the display device of FIG. 7.

First, referring to FIG. 9, a base member SUB and a barrier layer BR may be formed on a carrier substrate CG.

The base member SUB may include polyimide (PI). For example, the carrier substrate CG may be a carrier glass, but is not limited thereto. The carrier substrate CG may support the base member SUB in the process of forming a display layer DPL and an encapsulation layer TFE on the base member SUB.

The barrier layer BR may be formed on the base member SUB. The barrier layer BR may include an inorganic material capable of preventing penetration of air or moisture.

Figure 10:
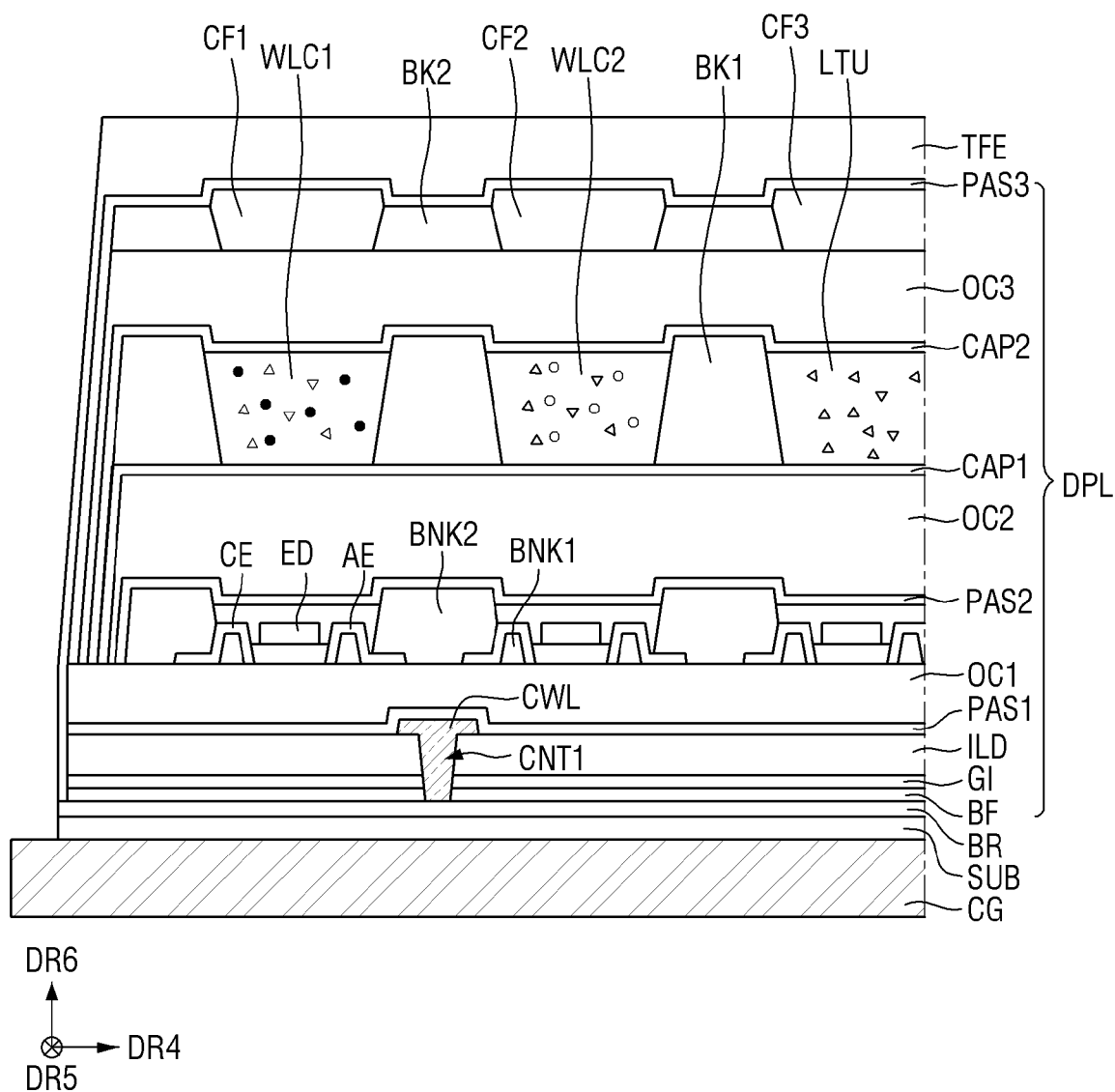

Subsequently, referring to FIG. 10, a display layer DPL and an encapsulation layer TFE may be formed on the barrier layer BR.

First, a display layer DPL may be formed on the barrier layer BR. The display layer DPL may include a connection wiring CWL. The connection wiring CWL may be inserted into a first contact hole CNT1 and exposed from the lower surface of the display layer DPL. The connection wiring CWL exposed from the lower surface of the display layer DPL may contact the upper surface of the barrier layer BR. For example, the connection wiring CWL may fill the first contact hole CNT1 through an inkjet process, a cutting process, or a plating process.

Subsequently, an encapsulation layer TFE may be formed on the display layer DPL. The encapsulation layer TFE may completely cover the upper and side surfaces of the display layer DPL. The encapsulation layer TFE may be also disposed on the upper surface of the barrier layer BR, on which the display layer DPL may not be formed, to completely seal the display layer DPL.

Figure 11:
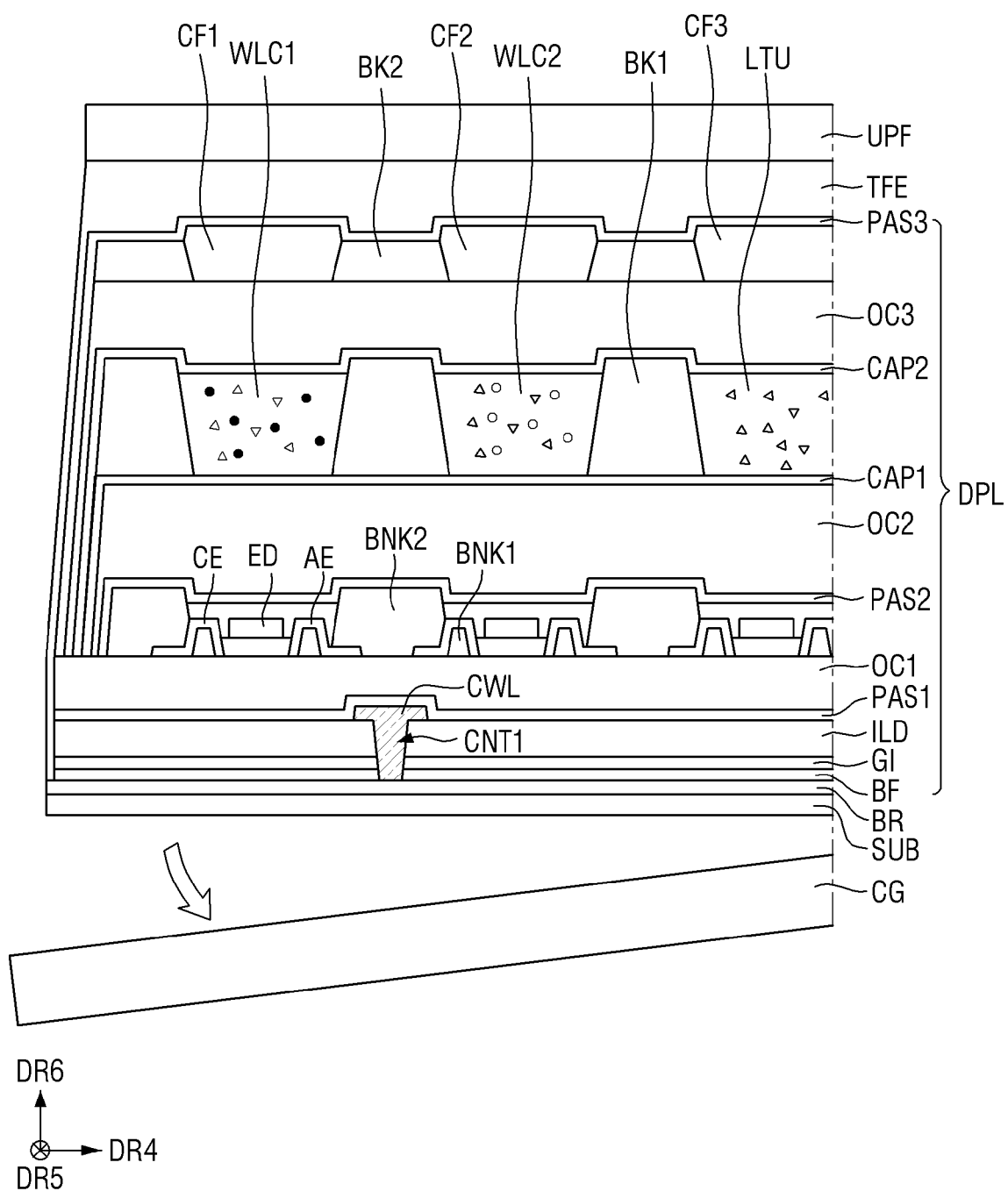

Subsequently, referring to FIG. 11, an upper film UPF may be formed on the encapsulation layer TFE, and the carrier substrate CG may be removed.

Specifically, the upper film UPF may be a carrier glass or a protective film, but is not limited thereto. The upper film UPF may serve to support the encapsulation layer TFE and the display layer DPL in subsequent processes of forming a first hole HA1 penetrating the base member SUB and the barrier layer BR and forming a lead line LDL, a pad portion PAD, and first and second lower protective layers LP1 and LP2, which will be described later. After the upper film UPF may be formed, the display device being manufactured may be inverted, and the upper film UPF may support the encapsulation layer TFE and the display layer DPL.

The carrier substrate CG may be removed after the stacking of the display layer DPL, the encapsulation layer TFE, and the upper film UPF may be completed.

Hereinafter, FIGS. 12 to 18 illustrate a process of inverting the display device being manufactured to form members disposed on the lower surface of the display layer DPL. It should be noted that in FIGS. 12 to 18, the direction facing downward may be the sixth direction DR6.

Figure 12:
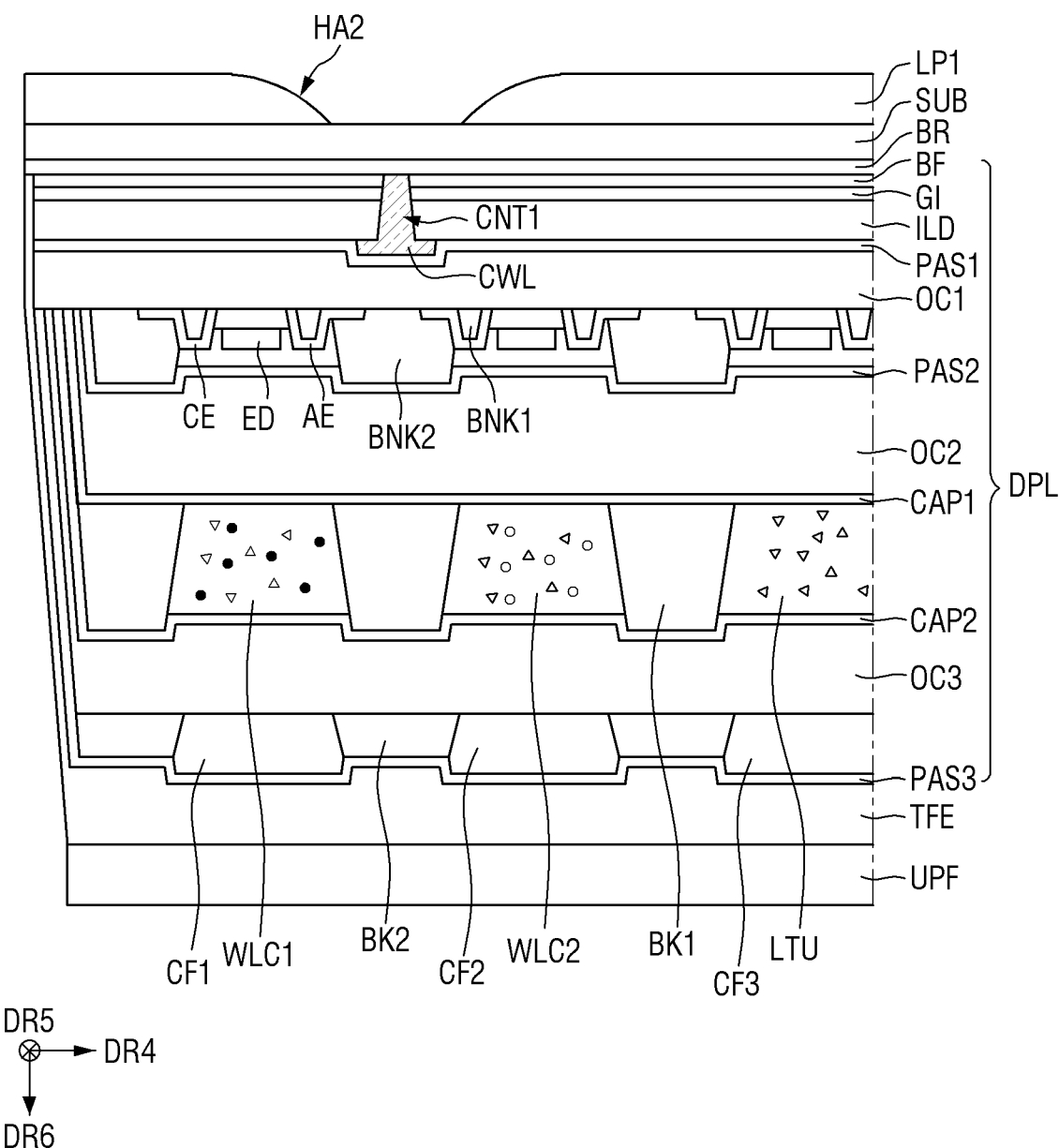

Subsequently, referring to FIG. 12, after the upper film UPF may be formed, the carrier substrate CG may be removed and the display device being manufactured may be inverted, a first lower protective layer LP1 may be formed on the base member SUB.

The first lower protective layer LP1 may be patterned and formed on the lower surface of the base member SUB. Specifically, the first lower protective layer LP1 may not be disposed in an area overlapping the connection wiring CWL of the display layer DPL in the thickness direction. For example, in order to form the first hole HA1, the first lower protective layer LP1 may be formed only in an area except for an area where the base member SUB and the barrier layer BR need to be removed. The first lower protective layer LP1 may be formed only in the area in which the base member SUB and the barrier layer BR need to be removed in order to form the first hole HA1, so that the first lower protective layer LP1 may include a second hole HA2 overlapping the connection wiring CWL in the thickness direction. The first lower protective layer LP1 may be patterned and formed on the lower surface of the base member SUB so as to expose the area where the base member SUB and the barrier layer BR need to be removed, so that the first lower protective layer LP1 may be used as an etching mask in a subsequent process.

The first lower protective layer LP1 may be formed by applying a material included in the first lower protective layer LP1 onto the base member SUB through a printing process without a separate mask process. For example, the first lower protective layer LP1 may include a material having predetermined fluidity but having viscosity to such a degree that the material can be patterned on (e.g., directly patterned on) the lower surface of the base member SUB without a separate mask process. Further, the first lower protective layer LP1 may include a material that may remain without being completely removed by an etchant used in the process of etching the base member SUB and the barrier layer BR, which will be described later.

The first lower protective layer LP1 may include a different material from the base member SUB. In an embodiment, in case that the base member SUB includes polyimide (PI), the first lower protective layer LP1 may include acrylic resin. The acrylic resin may be a material having a significantly lower etching rate for an etchant used in the process of etching polyimide (PI) than that of polyimide (PI).

The first lower protective layer LP1 may be stably formed by applying an acrylic resin having fluidity onto the lower surface of the base member SUB and curing the applied acrylic resin through a UV curing or thermal curing process. In order to form the first lower protective layer LP1, an additional mask process or a process of forming a partition wall may be omitted, and a UV-curing or thermal curing process may be performed while applying an acrylic resin onto the lower surface of the base member SUB. Through such a process, as illustrated in FIG. 12, the side surface of the first lower protective layer LP1 constituting the second hole HA2 may be formed as a curved surface. The angle formed between the side surface of the first lower protective layer LP1 constituting the second hole HA2 and the lower surface of the base member SUB may be an acute angle.

Subsequently, referring to FIG. 13, the base member SUB and the barrier layer BR may be etched using the first lower protective layer LP1 as an etching mask to form the first hole HA1.

Specifically, the base member SUB and the barrier layer BR may be sequentially etched using the first lower protective layer LP1 formed on the lower surface of the base member SUB as an etching mask. The base member SUB and the barrier layer BR disposed in an area where the first lower protective layer LP1 may not be formed may be removed through the etching process to form the first hole HA1. The first hole HA1 may expose the connection wiring CWL exposed to the lower surface of the display layer DPL. The etching process using the first lower protective layer LP1 formed on the lower surface of the base member SUB as an etching mask may be formed by overall etching. The overall etching may be performed by a dry etching process or a wet etching process.

The etching process may be performed using a difference in etching selectivity between the first lower protective layer LP1 and the base member SUB. In an embodiment in which the first lower protective layer LP1 includes acrylic resin and the base member SUB includes polyimide (PI), in the etchant for etching the base member SUB, an etching rate for the base member SUB may be significantly higher than that for the first lower protective layer LP1. For example, the etchant for etching the base member SUB may have a maximum etching selectivity of polyimide (PI) and acrylic resin of about 20000:1, but the disclosure is not limited thereto. Due to the difference in etching selectivity between the first lower protective layer LP1 and the base member SUB, in the etching process, the first lower protective layer LP1 having a low etching rate may not be removed, and the base member SUB having a high etching rate may be exposed and removed by the second hole HA2.

Figure 14:
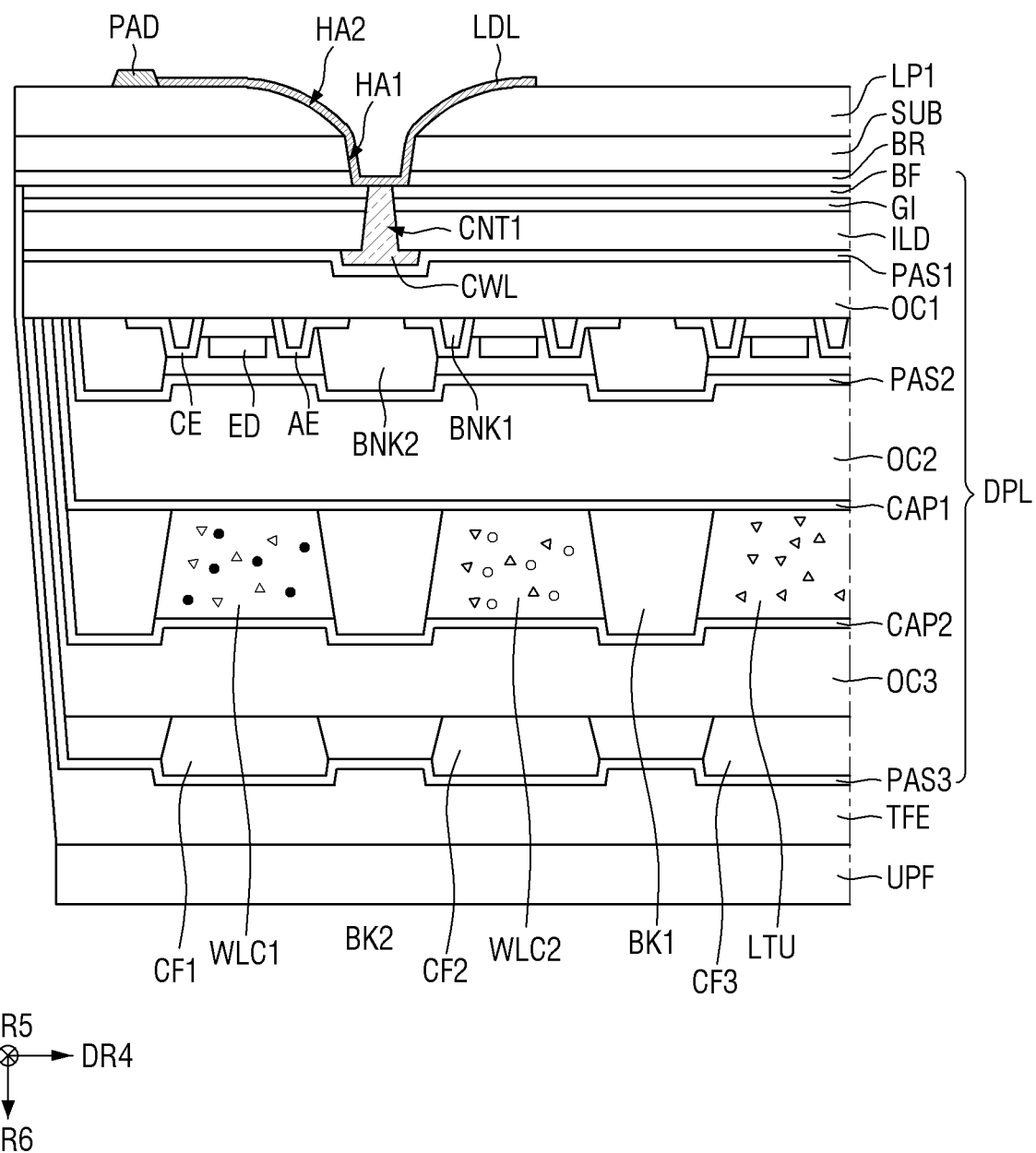

Subsequently, referring to FIG. 14, a pad portion PAD may be formed on the lower surface of the first lower protective layer LP1, and a lead line LDL electrically connecting the pad portion PAD and the connection wiring CWL may be formed.

The pad portion PAD may be formed on the lower surface of the first lower protective layer LP1 so as to be spaced apart from the first and second holes HA1 and HA2 in a plan view.

The lead line LDL electrically connecting the pad portion PAD and the connection wiring CWL may be formed. The lead line LDL may be disposed between the pad portion PAD and the connection wiring CWL. The lead line LDL may be in contact with the connection line CWL through the first hole HA1 and the second hole HA2. The lead line LDL may be formed on the lower surface of the first lower protective layer LP1 and the side surfaces of the barrier layer BR, base member SUB and the first lower protective layer LP1 constituting the sidewalls of the first and second holes HA1 and HA2. For example, the lead line LDL may be integrally formed with the pad portion PAD, but the disclosure is not limited thereto.

Figure 15:
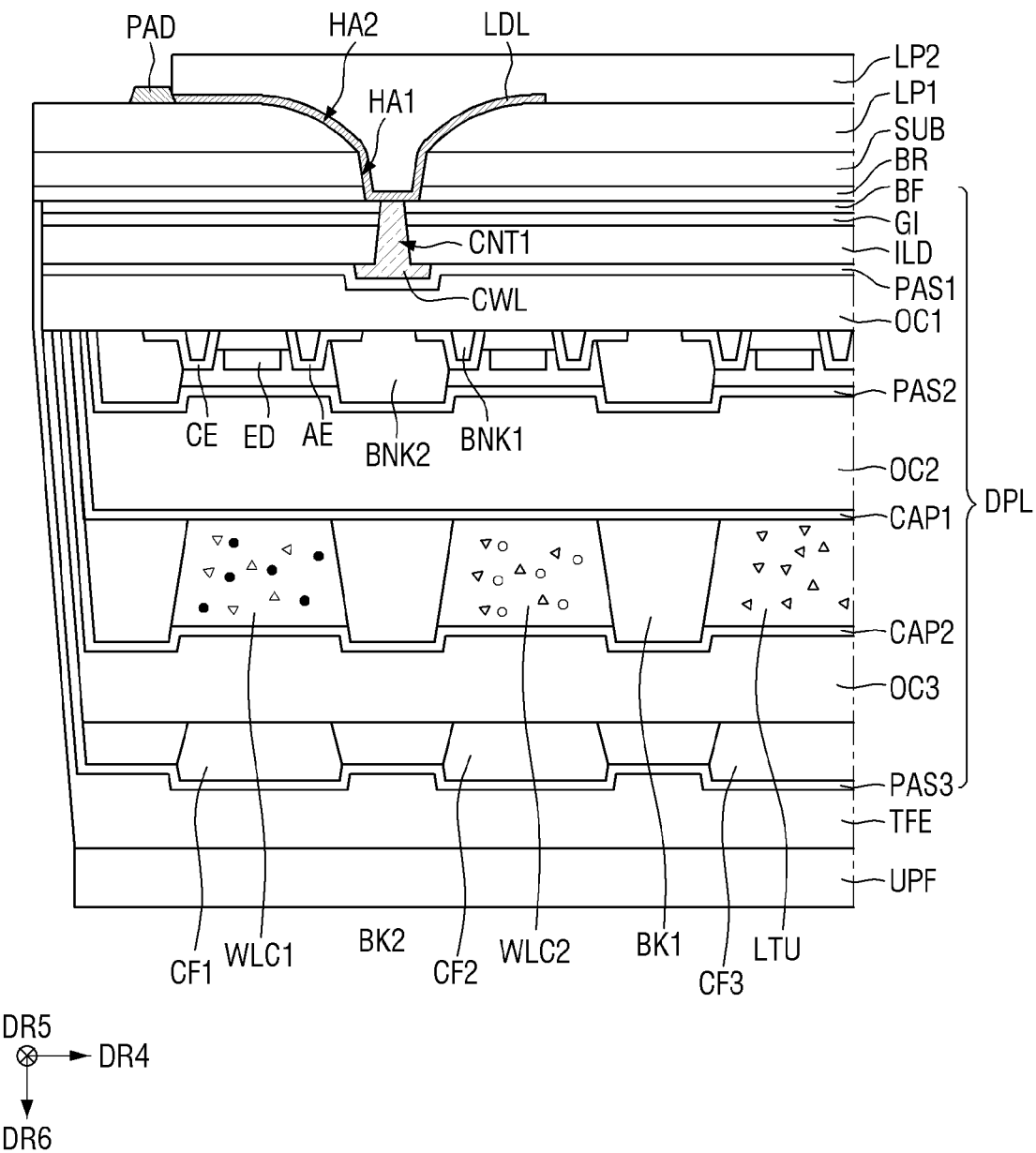

Subsequently, referring to FIG. 15, a second lower protective layer LP2 may be formed on the lead line LDL and the first lower protective layer LP1.

The second lower protective layer LP2 may cover the lower surfaces of the lead line LDL and the first lower protective layer LP1. For example, the second lower protective layer LP2 may cover an area of the lower surface of the first lower protective layer LP1, the area not being provided with the pad portion PAD. The second lower protective layer LP2 may fill the first and second holes HA1 and HA2.

For example, the second lower protective layer LP2 may include at least one of acrylic resin, epoxy resin, phenolic resin, polyamide resin, unsaturated polyester resin, polyphenylene ether resin, polyphenylene sulfide resin, and benzocyclobutene resin.

Figure 16:
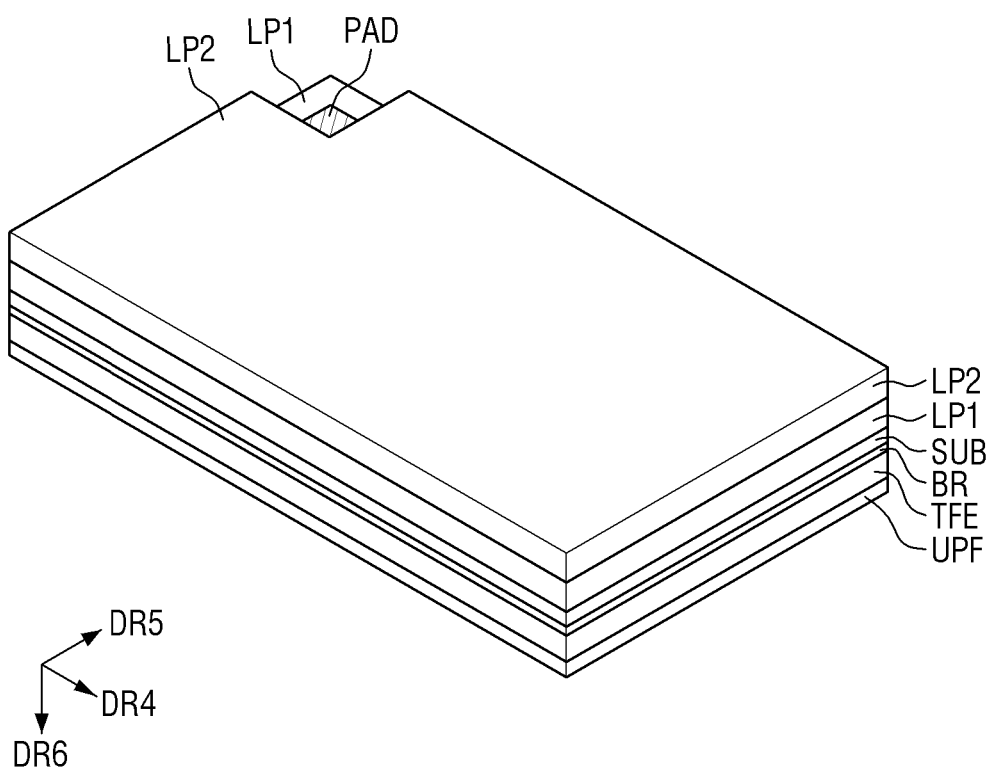

The second lower protective layer LP2 may be formed through a printing process or coating process using an organic material. For example, an organic material having fluidity may be provided on the lower surface of the first lower protective layer LP1 through an inkjet printing process, a spin coating process, or a slit coating process. In the display device 10, the second lower protective layer LP2 may be formed through a printing process or coating process using an organic material, so that the lower surface of the display device 10 may be flattened, and the defective rate of the second lower protective layer LP2 may be reduced. As the second lower protective layer LP2 may be entirely disposed on the lower surface of the first lower protective layer LP1, except for the pad portion PAD, as shown in FIG. 16, a structure exposing only the area where the pad portion PAD may be disposed may be formed.

Figure 17:
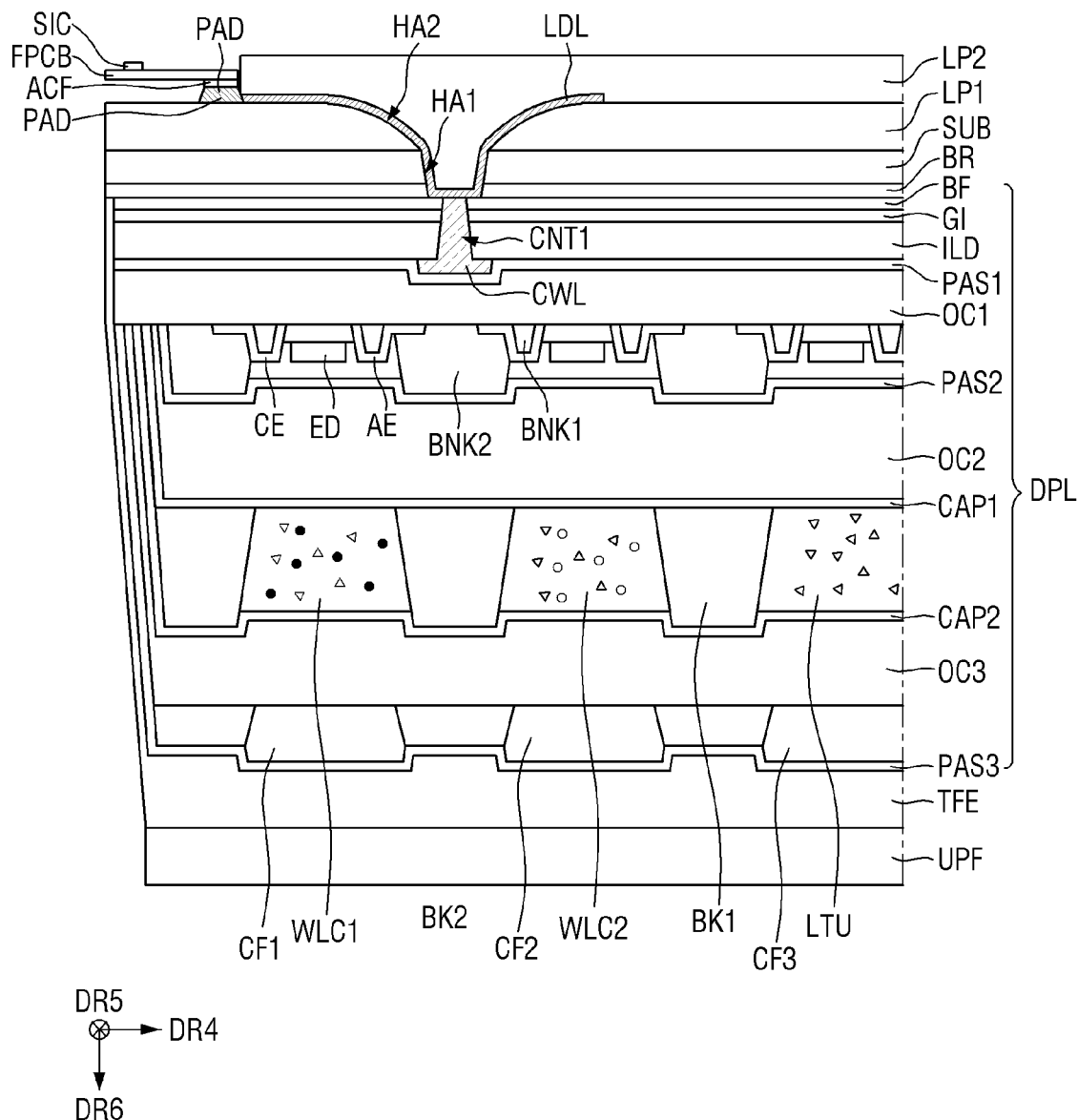

Subsequently, referring to FIG. 17, a flexible film FPCB may be disposed under the display layer DPL. One side of the flexible film FPCB may be connected to the pad portion PAD, and the other side of the flexible film FPCB may be connected to a source circuit board (not shown) under the display layer DPL. The flexible film FPCB may transmit a signal from the source driver SIC to the circuit layer CCL. For example, the source driver SIC may be an integrated circuit (IC). The source driver SIC may convert digital video data into an analog data voltage based on a source control signal of the timing controller, and may supply the analog data voltage to the data line of the display area DA through the flexible film FPCB.

Figure 18:
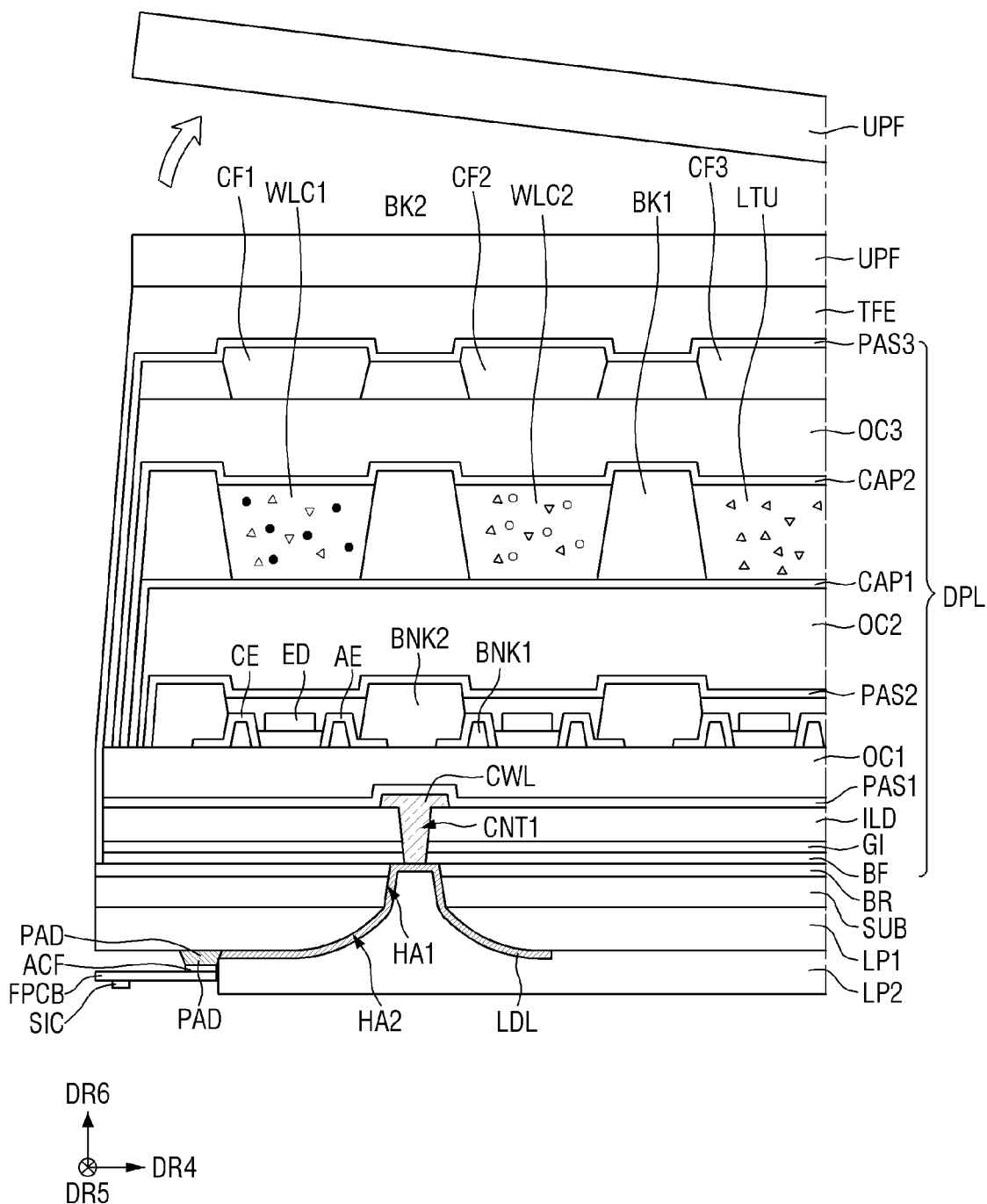

Subsequently, referring to FIG. 18, the display device provided with the flexible film FPCB may be inverted, and the upper film UPF formed on the encapsulation layer TFE may be removed to manufacture the display device 10 shown in FIG. 19.

According to a process of manufacturing the display device 10 according to an embodiment, the first lower protective layer LP1 included in the display device 10 may protect the upper members from the lower surface of the base member SUB in the etching process of forming the first hole HA1, and may be used as an etching mask. Accordingly, processes of applying, exposing and developing a photoresist layer for forming a photoresist pattern for forming a separate etching mask generally used in the etching process of forming the first hole HA1, and an ashing process or stripping process for removing the photoresist pattern may be omitted. Further, since the first lower protective layer LP1 may be used as an etching mask and also may serve as a lower protective layer, a separate process for forming the lower protective layer may be omitted. Accordingly, economic efficiency of the process of manufacturing the display device 10 may be improved.

Hereinafter, other embodiments will be described. In the following embodiments, for the same configuration as previously described, redundant descriptions will be omitted or simplified, and differences will be described.

Figure 20:
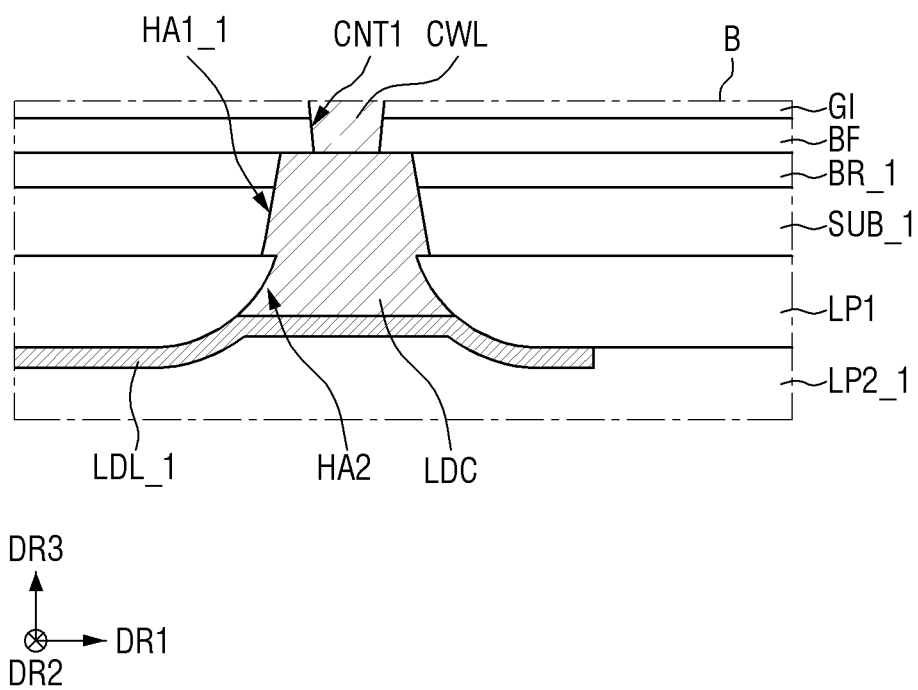
FIG. 20 is an enlarged schematic cross-sectional view of another example of area B of FIG. 7.

FIG. 20 is an enlarged schematic cross-sectional view of another example of area B of FIG. 7.

Referring to FIG. 20, an embodiment may be different from embodiments of FIG. 8 in that the side surfaces of the base member SUB_1 and barrier layer BR_1 constituting the first hole HA1_1 may be aligned inward compared to the side surface of the first lower protective layer LP1 constituting the second hole HA2.

Specifically, the side surface of the first lower protective layer LP1 constituting the second hole HA2 may have an under-cut shape in which the side surface thereof protrudes outward from the side surfaces of the base member SUB_1 and barrier layer BR_1 constituting the first hole HA1_1. The under-cut shape in which the side surface of the first lower protective layer LP1 constituting the second hole HA2 protrudes from the side surface of the base member SUB_1 constituting the first hole HA1_1 may be formed by a difference in etching selectivity between the base member SUB_1 and the first lower protective layer LP1 used in the etching process for forming the first hole HA1_1.

Figure 13:
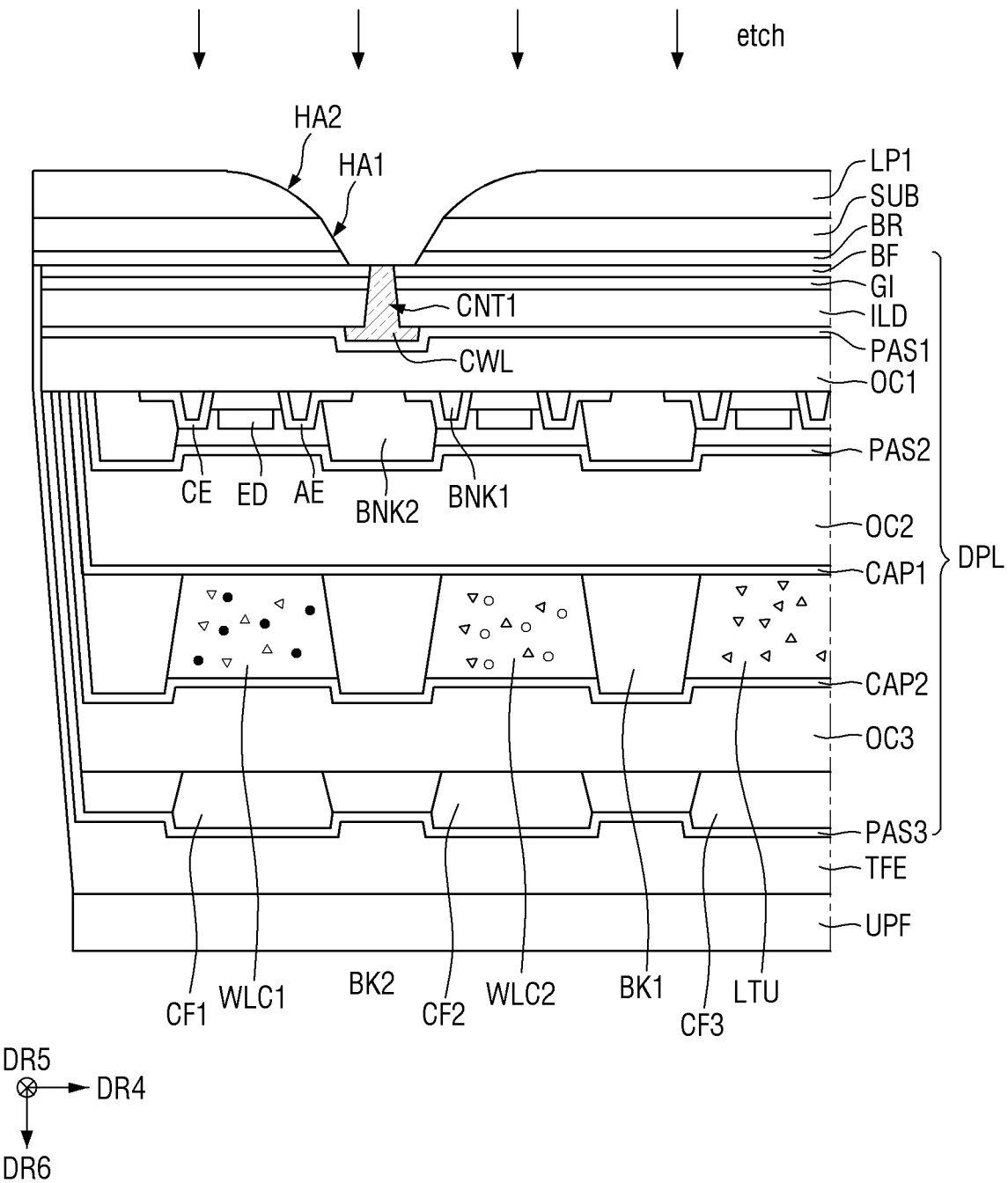

Explaining this fact in conjunction with FIG. 13, in the process of etching the base member SUB and the barrier layer BR using the first lower protective layer LP1 as an etching mask, the etch rate of the base member SUB may be significantly higher than that of the first lower protective layer LP1, so that, in FIG. 13, the base member SUB disposed under the first lower protective layer LP1 (a direction opposite to the sixth direction DR6 in the drawing) may be over-etched. Therefore, according to the difference in the etching selectivity between the base member SUB_1 and the first lower protective layer LP1, the side surface of the first lower protective layer LP1 may have an undercut shape in which the side surface of the first lower protective layer LP1 protrudes from the side surface of the base member SUB_1.

Accordingly, the display device according to an embodiment may further include a lead contact portion LDC filling an area partitioned by the first hole HA1_1 and the second hole HA2. The lead contact portion LDC may fill the area partitioned by the first hole HA1_1 and the second hole HA2 to electrically connect the lead line LDL_1 and the connection wiring CWL.

In an embodiment, in case that the lead line LDL_1 may be formed on the first hole HA1_1 and the second hole HA2, due to the under-cut shape formed by a difference in etching selectivity between the base member SUB_1 and the first lower protective layer LP1, the lead line LDL_1 may be disconnected. Accordingly, the lead contact portion LDC may fill the first hole HA1_1 and the second hole HA2, and the lead line LDL_1 may be formed on the lead contact portion LDC, thereby reducing the defects in electrical connection between the lead line LDL_1 and the connection wiring CWL.

Figure 21:
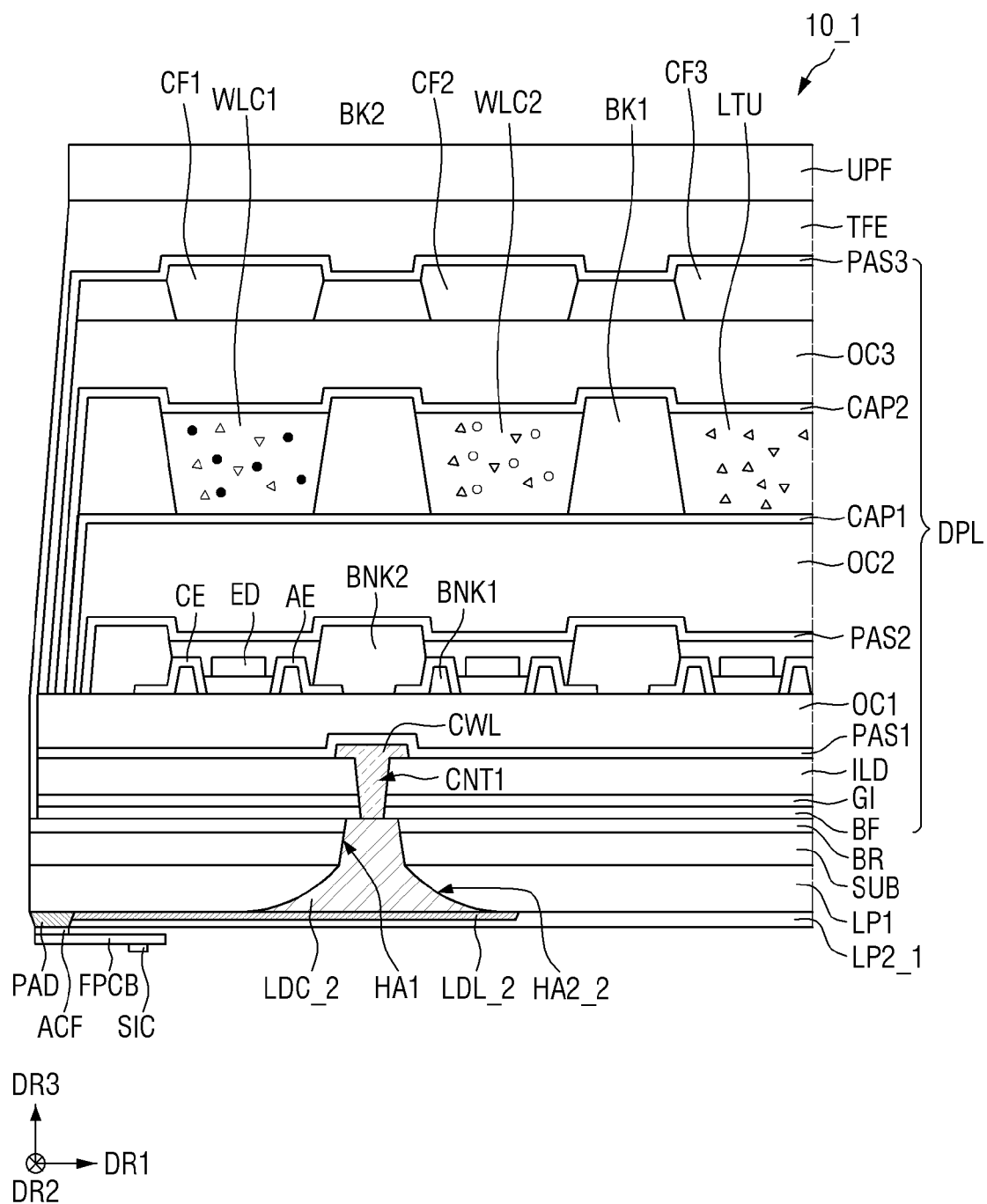
FIG. 21 is a schematic cross-sectional view of a display device according to another embodiment.

FIG. 21 is a schematic cross-sectional view of a display device according to another embodiment.

Figure 19:
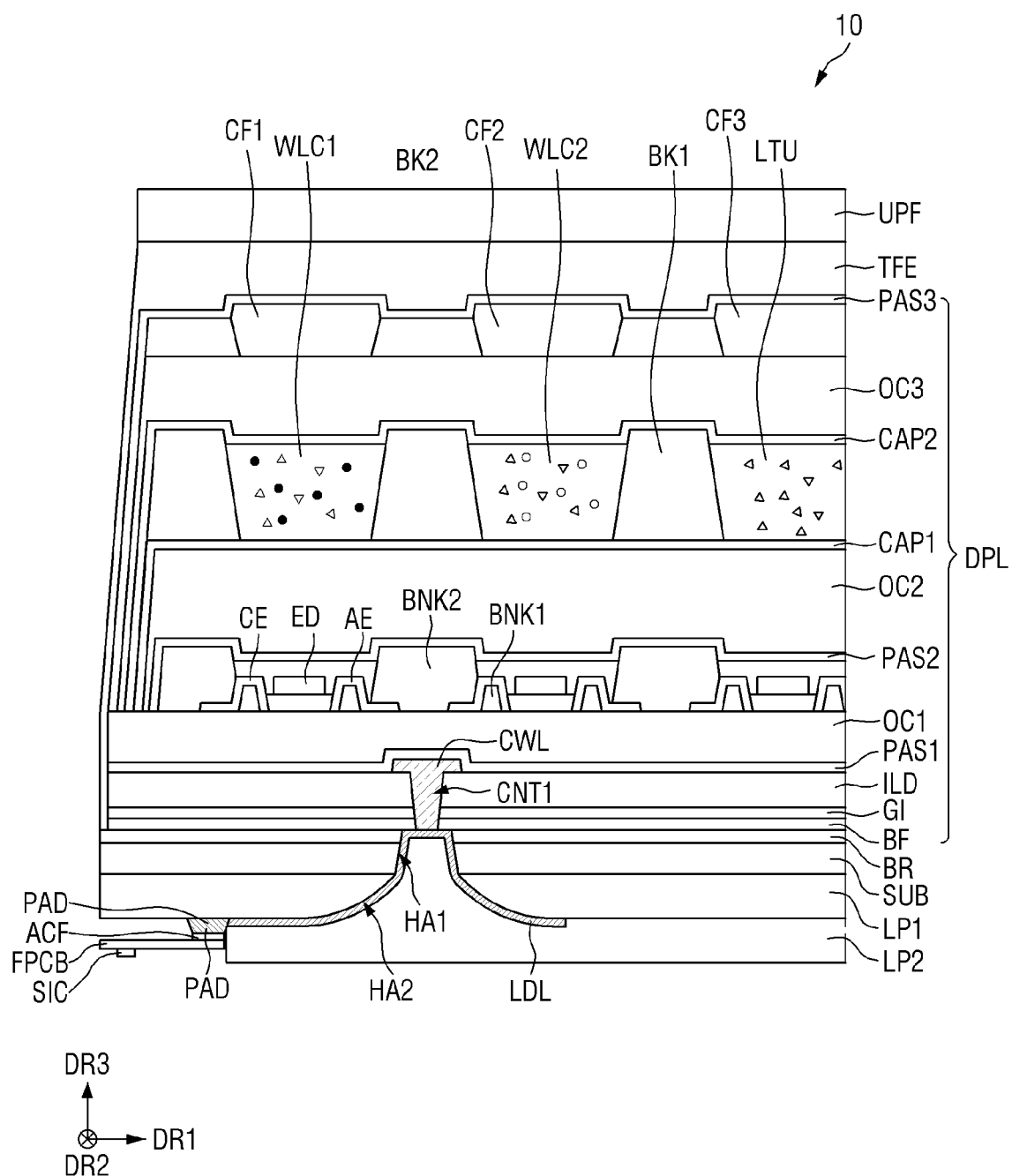

Referring to FIG. 21, a display device 10_1 according to an embodiment may be different from the display device 10 of FIG. 19 in that a lead contact portion LDC_2 may be formed in an area partitioned by the first hole HA1 and the second hole HA2.

Specifically, the lead contact portion LDC_2 may fill the first hole HA1 of the barrier layer BR and the base member SUB, and the second hole HA2_2 of the first lower protective layer LP1. For example, the lead contact portion LDC_2 may include a metal material or a conductive material. The lead contact portion LDC_2 may flatten the lower surface of the first lower protective layer LP1. The lower surface of the lead contact portion LDC_2 and the lower surface of the first lower protective layer LP1 may be disposed on the same plane.

The lead line LDL_2 may be disposed on the lower surfaces of the first lower protective layer LP1 and the lead contact portion LDC_2. For example, the lead line LDL_2 may be integrally formed with the pad portion PAD, but the disclosure is not limited thereto. The lead line LDL_2 may cover the first and second holes HA1 and HA2, and may be connected to the lead contact portion LDC_2 filling the first and second holes HA1 and HA2. The lead line LDL_2 may have a spider shape, but the shape thereof is not limited thereto.

In an embodiment, the flexible film FPCB may be disposed under the second lower protective layer LP2_1. One side of the flexible film FPCB may be connected to the pad portion PAD, and the other side of the flexible film FPCB may be connected to a source circuit board (not shown) under the second lower protective layer LP2_1. The flexible film FPCB may transmit a signal from the source driver SIC to the circuit layer CCL.

Figure 22:
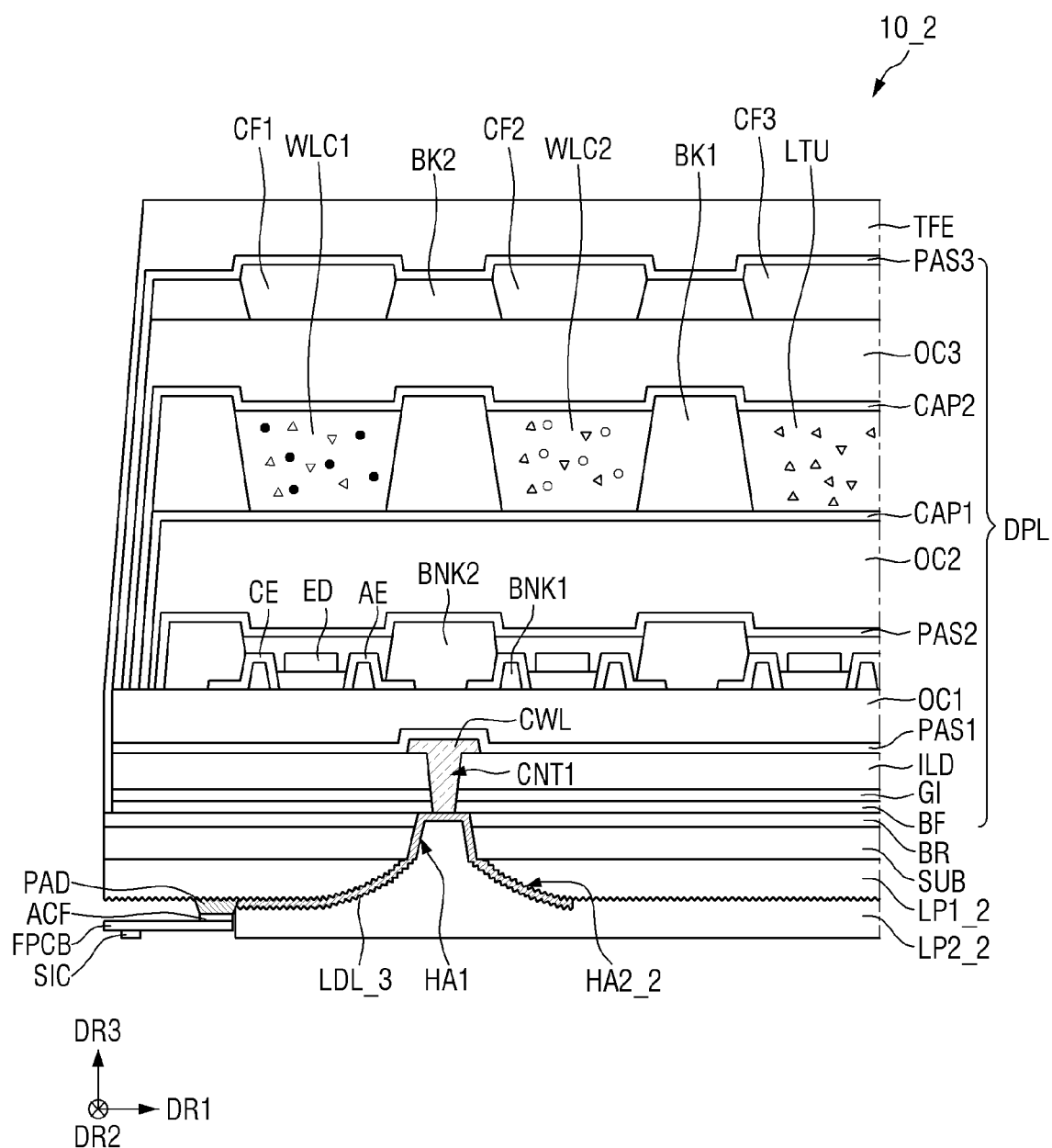
FIG. 22 is a schematic cross-sectional view of a display device according to still another embodiment.

FIG. 22 is a schematic cross-sectional view of a display device according to still another embodiment.

Referring to FIG. 22, a display device 10_2 according to an embodiment may be different from the display device 10 of FIG. 19 in that a predetermined surface roughness may be formed on the side and lower surfaces of a first lower protective layer LP1_2.

Specifically, a predetermined surface roughness may be formed on the side and lower surfaces of the first lower protective layer LP1_2. The surface roughness formed on the lower and side surfaces of the first lower protective layer LP1_2 may be formed by damage to the outer surface of the first lower protective layer LP1_2 by an etchant used in the etching process for forming the first hole HA1.

A predetermined surface roughness may also be formed in a part of the lead line LDL_3 formed on the side and lower surfaces of the first lower protective layer LP1_2. The lead line LDL_3 disposed in an area overlapping the first lower protective layer LP1_2 may have a predetermined roughness formed on the surface thereof. As the lead line LDL_3 may be conformally formed on the side and lower surfaces of the first lower protective layer LP1_2, a predetermined roughness may also be formed on the surface of the lead line LDL_3 similar to the shape of the side and lower surfaces of the first lower protective layer LP1_2.

In an embodiment, as a predetermined surface roughness may be formed on the lower and side surfaces of the first lower protective layer LP1_2, the surface area of the lower and side surfaces of the first lower protective layer LP1_2 may increase. Accordingly, an adhesive surface between the first lower protective layer LP1_2 and the members disposed on the lower and side surfaces of the first lower protective layer LP1_2 may increase, so that adhesive force between these members may be improved. Specifically, the area of the adhesive surface between the first lower protective layer LP1_2 and the second lower protective layer LP2_2 formed on the lower surface of the first lower protective layer LP1_2 may increase compared to a case where the surface roughness may not be formed, and the adhesive force between the second lower protective layer LP2_2 and the first lower protective layer LP1_2 may be improved. Similarly, the surface area of the lead line LDL_3 formed in the lower surface of the first lower protective layer LP1_2 and in the second hole HA2_3 may also increase. Accordingly, adhesive force between the first lower protective layer LP1_2 and the lead line LDL_3 may also be improved.

Figure 23:
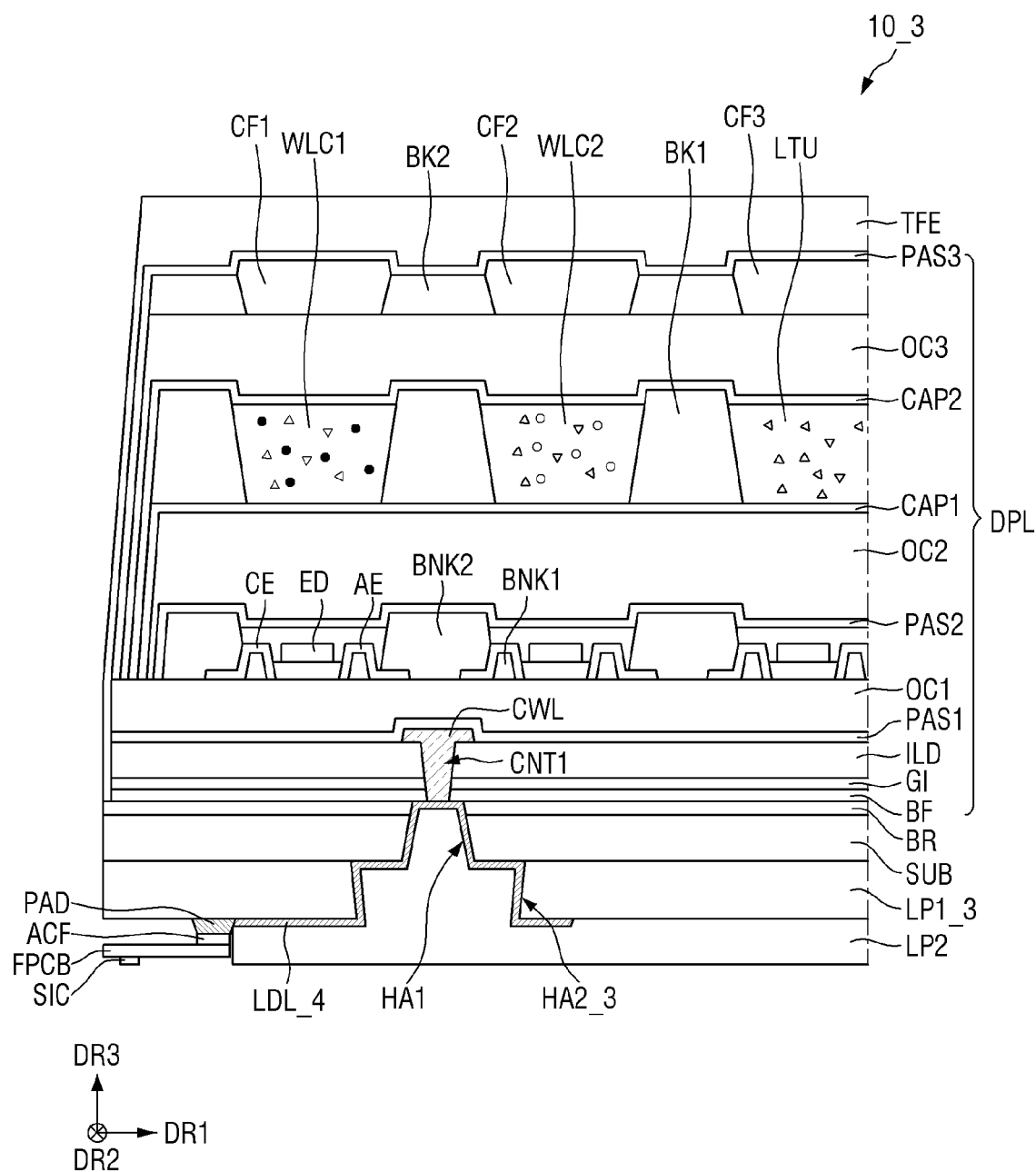
FIG. 23 is a schematic cross-sectional view of a display device according to still another embodiment.

FIG. 23 is a schematic cross-sectional view of a display device according to still another embodiment.

Referring to FIG. 23, a display device 10_3 according to an embodiment may be different from the display device 10 of FIG. 19 in that a second hole HA2_3 may have a large upper area and a narrow lower area, and a first lower protective layer LP1_3 may expose a part of the lower surface of the base member SUB.

Specifically, the first lower protective layer LP1_3 disposed on the lower surface of the base member SUB may expose at least a part of the lower surface of the base member SUB in the peripheral area of the first hole HA1. The side surface of the first lower protective layer LP1_3 forming the sidewall of the second hole HA2_3 may form an acute angle with respect to the lower surface of the first lower protective layer LP1_3. For example, the second hole HA2_3 may have a shape whose width increases toward the upward direction DR3.

A lead line LDL_4 formed in the first hole HA1 and the second hole HA2_3 may be disposed on the lower and side surfaces of the first lower protective layer LP1_3. The lead line LDL_4 may extend from the side surface of the lower protective layer LP1_3 toward the first hole HA1 and may be disposed on the lower and side surfaces of the base member SUB exposed by the first lower protective layer LP1_3.

In an embodiment, the first lower protective layer LP1_3 exposing the lower surface of the base member SUB may be formed through an inkjet printing process, and may be formed by an etching process for forming the first hole HA1.

Hereinafter, referring to other drawings, a method of manufacturing the display device 10_3 will be described.

Figure 24:
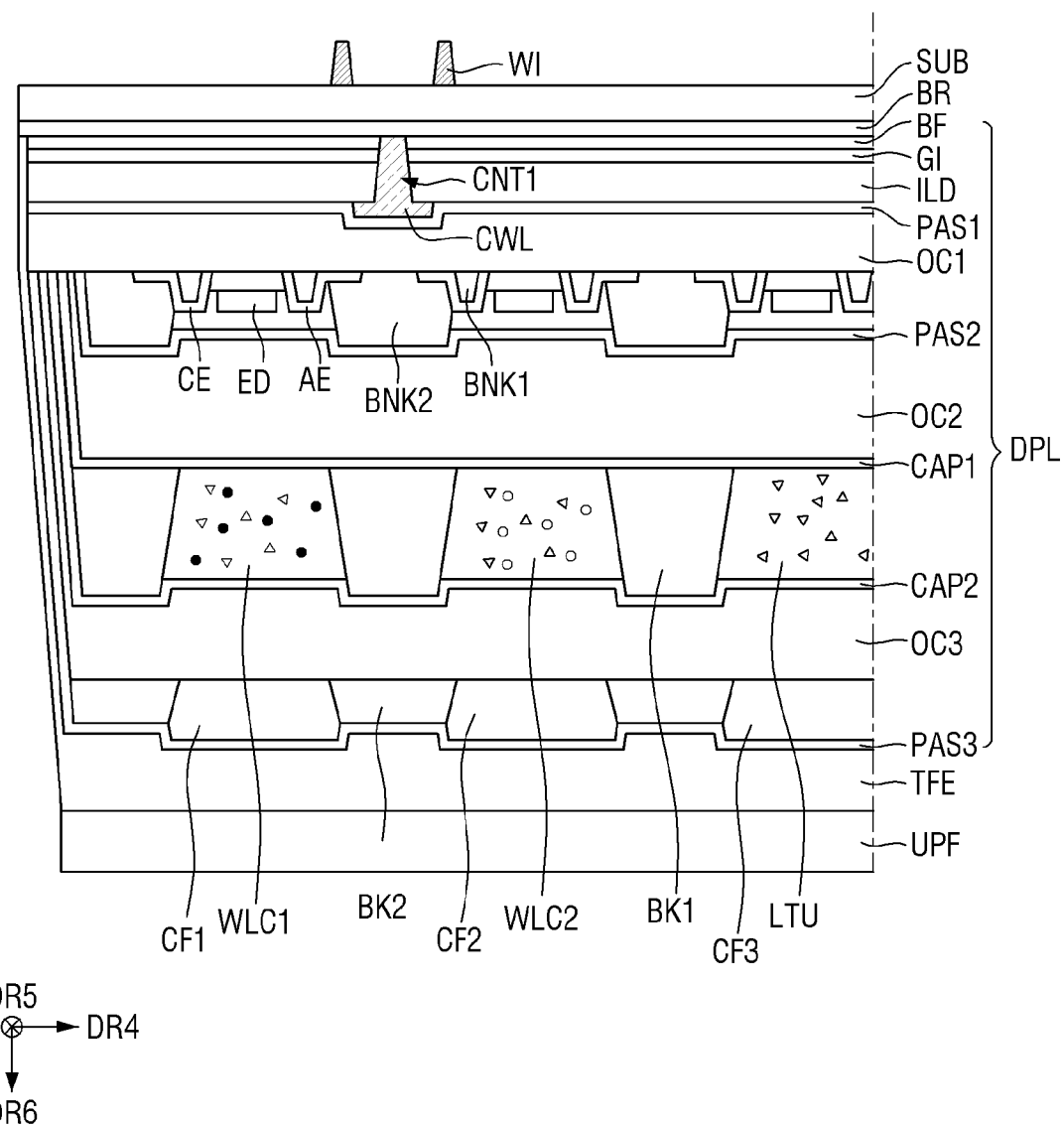
FIGS. 24 to 28 are schematic process views illustrating a process of manufacturing the display device of FIG. 23.

FIGS. 24 to 28 are schematic process views illustrating a process of manufacturing the display device of FIG. 23. FIG. 24 may illustrate a process following the above-described process of FIG. 11.

First, referring to FIG. 24, a partition wall WI may be formed on the base member SUB.

Specifically, the partition wall WI may serve to divide an area in which the inkjet printing process may be performed such that ink may not be applied to an area overlapping the connection wiring CWL in the inkjet printing process for forming the first lower protective layer LP1_3 to be described later. The partition wall WI may be disposed on the lower surface of the base member SUB, and may have a shape protruding in a direction opposite to the sixth direction DR6. The partition wall WI may have a shape whose width decreases toward a direction opposite to the sixth direction DR6, but the disclosure is not limited thereto. The partition wall WI may include polyimide (PI).

Figure 25:
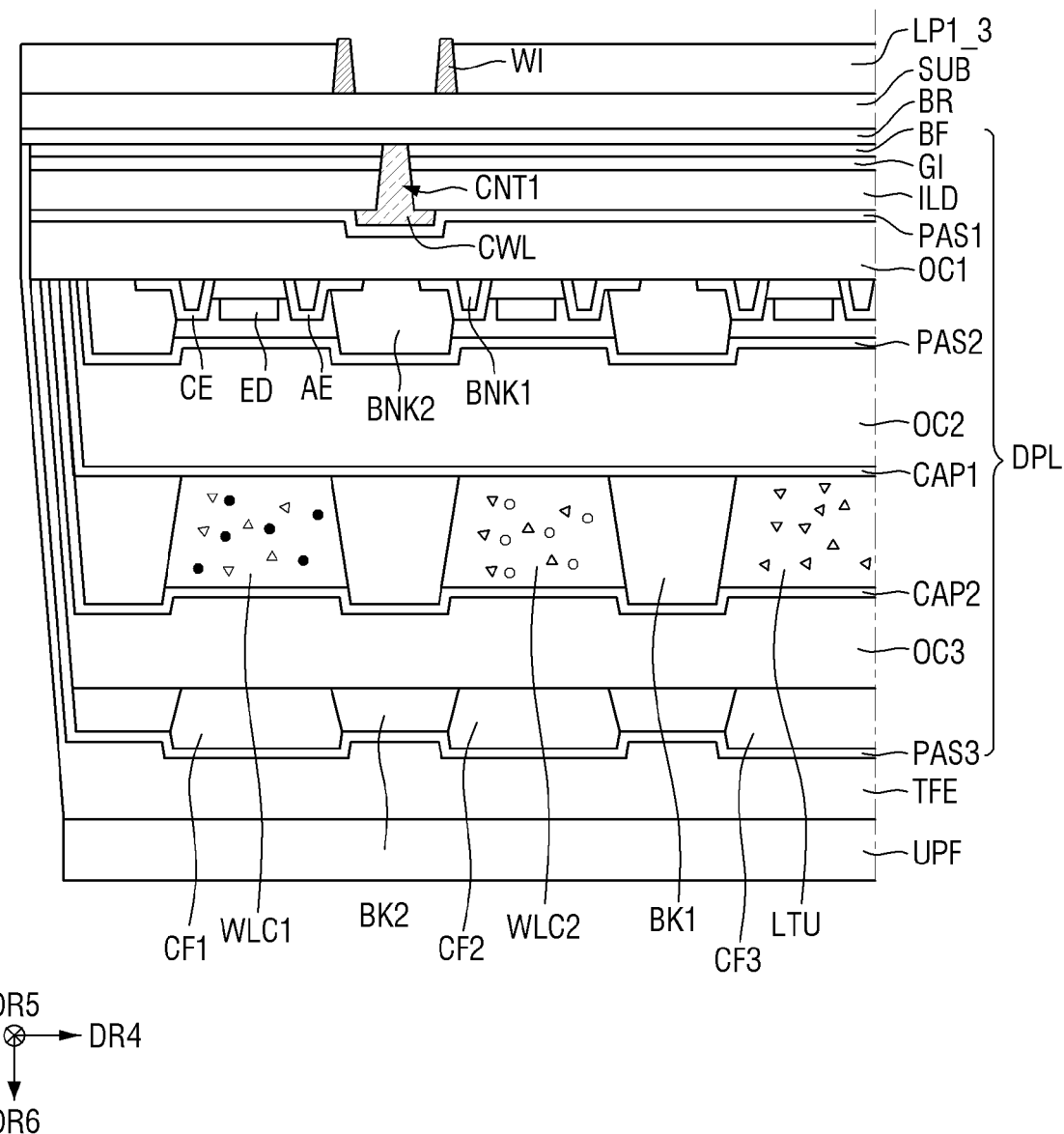

Subsequently, referring to FIG. 25, the first lower protective layer LP1_3 may be formed by applying ink to the area divided by the partition wall WI through an inkjet printing process. The ink may include a material included in the first lower protective layer LP1_3. In an embodiment, the ink may include acrylic resin.

Figure 26:
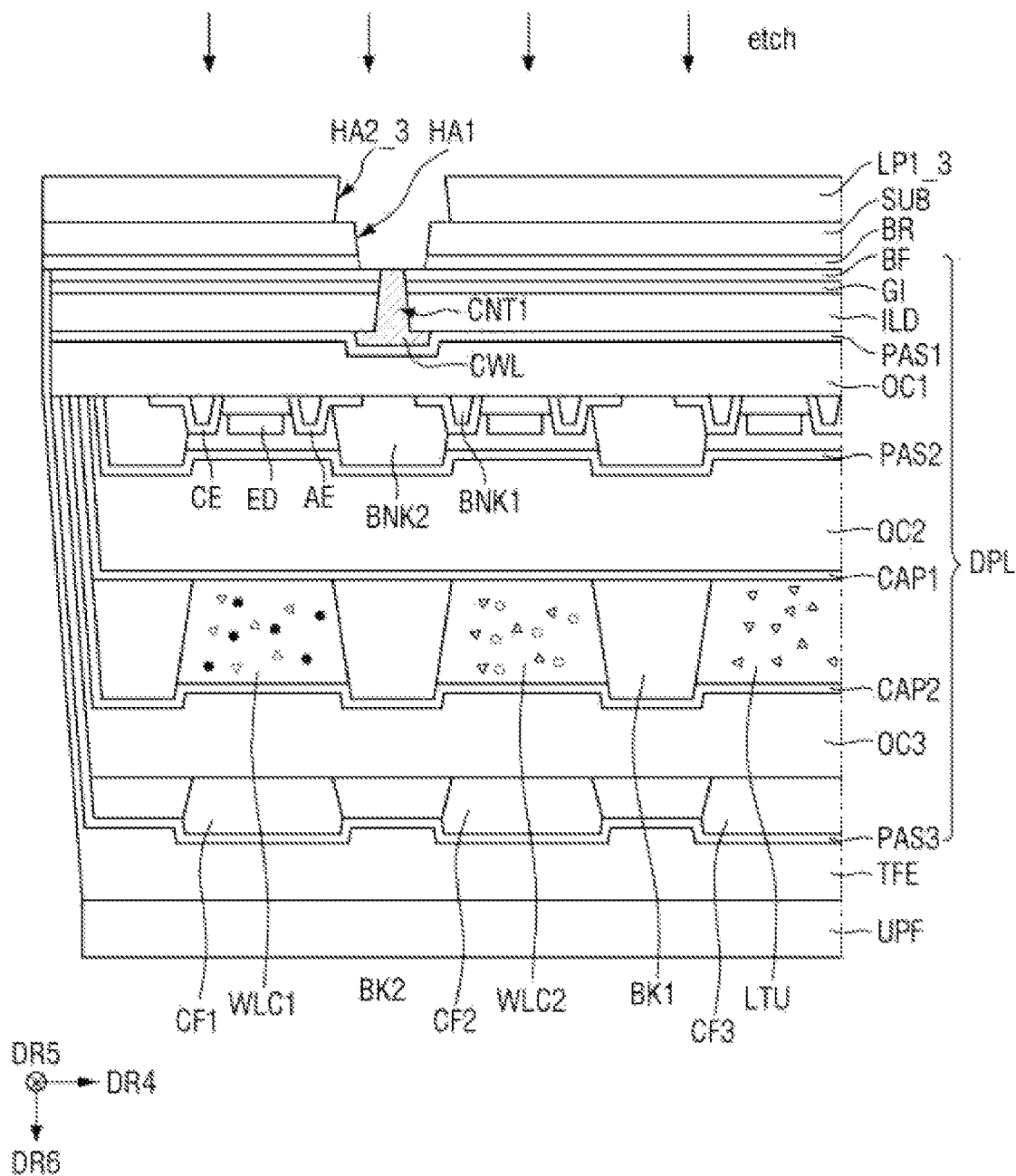

Subsequently, referring to FIG. 26, a first hole HA1 may be formed by etching the base member SUB and the barrier layer BR using the first lower protective layer LP1_3 as an etching mask.

In this etching process, the first lower protective layer LP1_3 may remain on the base member SUB without being completely removed due to a difference in the etching selectivity between the first lower protective layer LP1_3 and the base member SUB, and the base member SUB and the barrier layer BR may be etched to expose the connection wiring CWL. Since the side wall WI including the same material as the base member SUB may be removed during this etching process, as shown in FIG. 26, the first lower protective layer LP1_3 may expose at least a part of the base member SUB, and the side surface of the remaining first lower protective layer LP1_3 may have a shape corresponding to the shape of the side surface of the partition wall WI.

Figure 27:
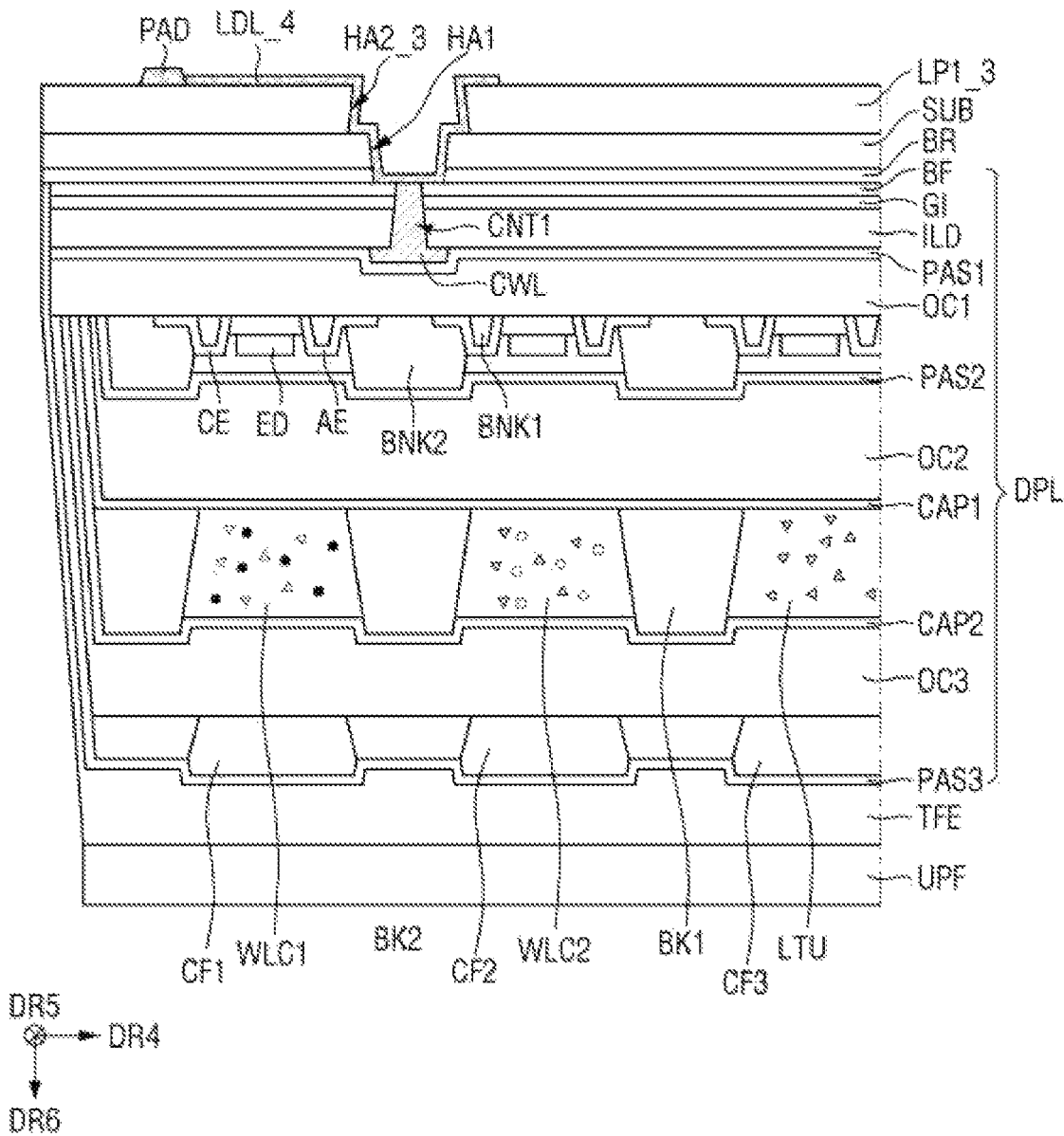

Subsequently, referring to FIG. 27, a pad portion PAD and a lead line LDL_4 may be formed on the first lower protective layer LP1_3. The pad portion PAD may not overlap the first hole HA1 and the second hole HA2_3 in a plan view. The pad portion PAD may be electrically connected to the connection wiring CWL by the lead line LDL_4 formed in the first and second holes HA1 and HA2.

Figure 28:
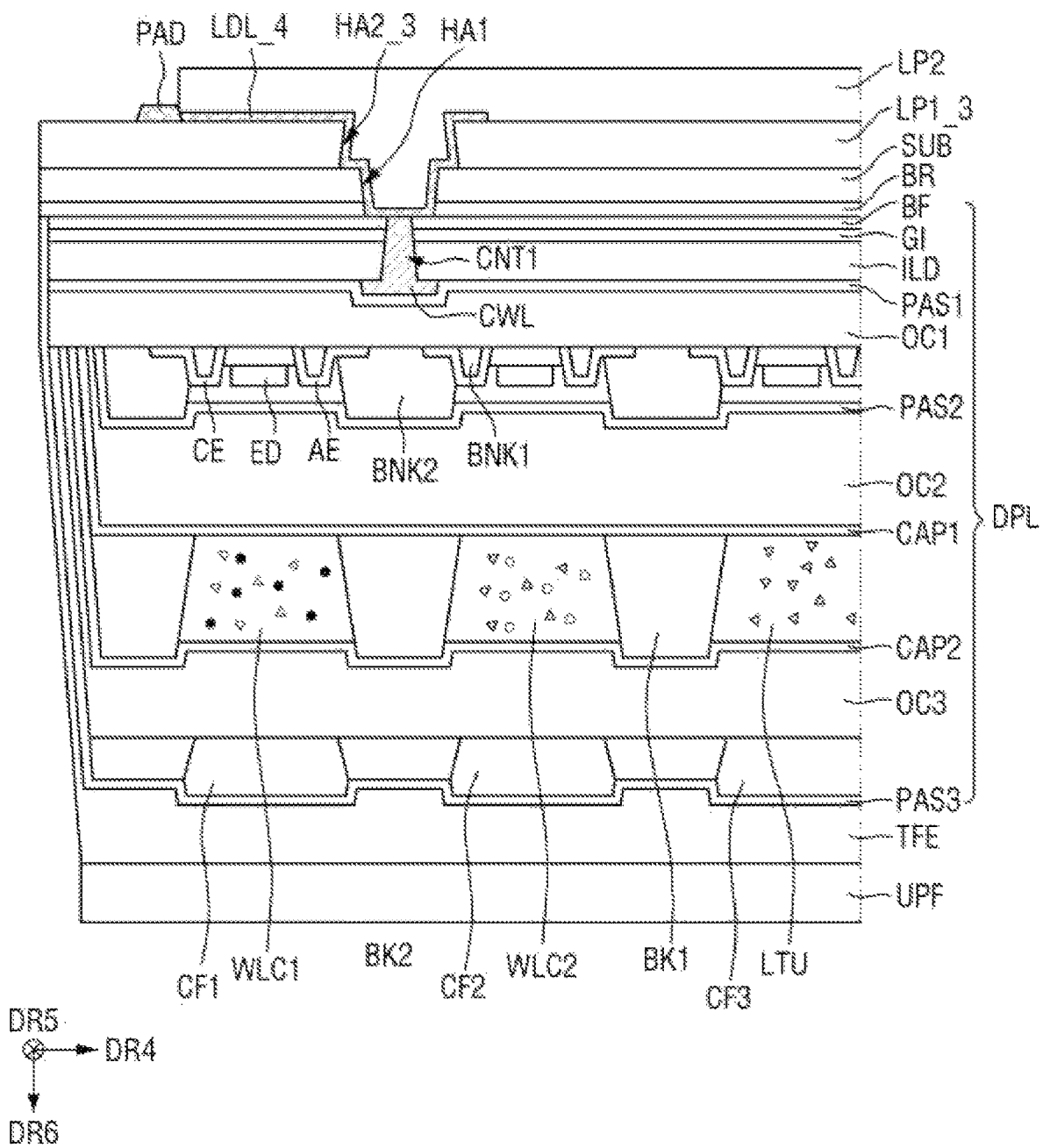

Subsequently, referring to FIG. 28, a second lower protective layer LP2 may be formed on the lower surface of the first lower protective layer LP1_3. The second lower protective layer LP2 may be formed through a printing process or coating process using an organic material. For example, an organic material having fluidity may be provided on the lower surface of the first lower protective layer LP1_3 through an inkjet printing process, a spin coating process, or a slit coating process. In the display device 10, the second lower protective layer LP2 may be formed through a printing process or coating process using an organic material, so that the lower surface of the display device 10 may be flattened, and the defective rate of the second lower protective layer LP2 may be reduced. The second lower protective layer LP2 may be entirely disposed on the lower surface of the first lower protective layer LP1_3, except for the pad portion PAD.

As described above, a flexible film FPCB may be formed under the display layer DPL to manufacture the display device 10_3 shown in FIG. 23. One side of the flexible film FPCB may be connected to the pad portion PAD, and the other side of the flexible film FPCB may be connected to a source circuit board (not shown) under the display layer DPL. The flexible film FPCB may transmit a signal from the source driver SIC to the circuit layer CCL. For example, the source driver SIC may be an integrated circuit (IC). The source driver SIC may convert digital video data into an analog data voltage based on a source control signal of the timing controller, and may supply the analog data voltage to the data line of the display area DA through the flexible film FPCB.

FIGS. 29 to 32 are schematic process views for explaining another example of patterning using a lower protective layer as an etching mask.

In FIGS. 29 to 32, a seventh direction DR7 and an eighth direction DR8 are defined. The seventh direction DR7 and the eighth direction DR8 may be directions perpendicular to each other in one plane. The "upper" may refer to a side on which a conductive layer ML' may be disposed with respect to a first substrate BSUB toward one side in the eighth direction DR8, and the "upper surface" may refer to a surface facing one side in the eighth direction DR8. Further, the "lower" may refer to the other side toward a direction opposite to the eighth direction DR8, and the "lower surface" may refer to a surface facing the other side in the eighth direction DR8.

The process of patterning underlying members using the above-described lower protective layer as an etching mask may be practically used not only in the base member including polyimide but also in members including different materials. For example, a process of patterning a conductive material disposed under the lower protective layer as an etching mask may also be used.

Figure 29:
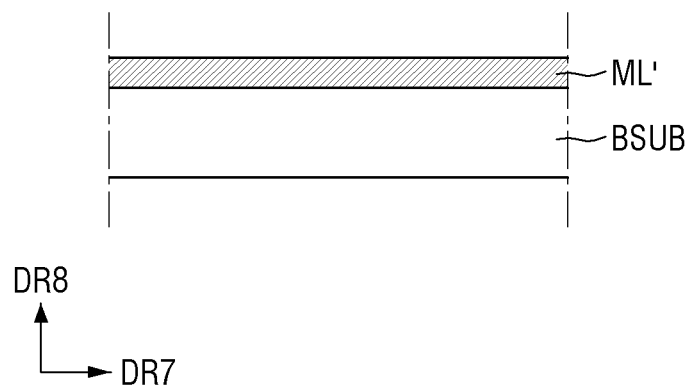
FIGS. 29 to 32 are schematic process views for explaining another example of patterning using a lower protective layer as an etching mask.

Specifically, referring to FIG. 29, a conductive layer ML' may be formed on a first substrate BSUB. The first substrate BSUB is not particularly limited. For example, the first substrate BSUB may be a display device provided with the display layer DPL. The conductive layer ML' formed on one surface of the first substrate BSUB may include a conductive material. For example, the conductive layer ML' may include a transparent conductive material.

Figure 30:
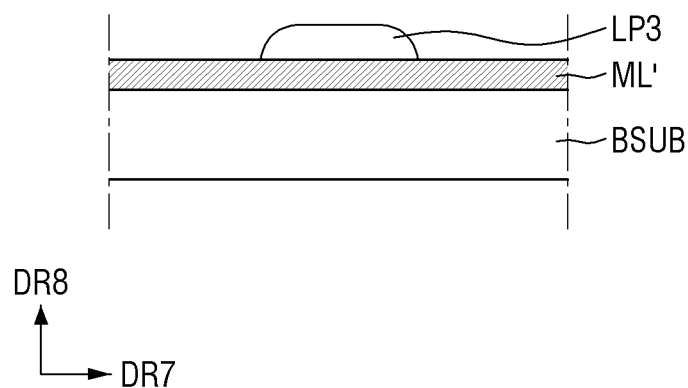

Subsequently, referring to FIG. 30, a patterned third lower protective layer LP3 may be formed on the conductive layer ML'. The third lower protective layer LP3 may be formed in an area where the conductive layer ML' may be to remain in order to pattern the conductive layer ML'. The third lower protective layer LP3 may include a material having an etching rate lower than that of the conductive layer ML' with respect to the etchant used in the etching process for forming the conductive layer ML'.

Figure 31:
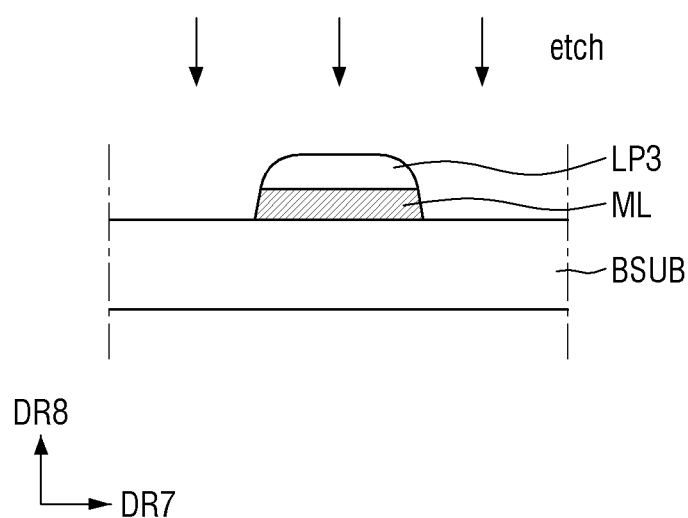

Subsequently, referring to FIG. 31, a conductive pattern ML may be formed by etching the conductive layer ML' using the third lower protective layer LP3 as an etching mask. Similar to the above description, in this etching process by using a difference in etching selectivity between the conductive layer ML' and the third lower protective layer LP3, the process of forming a separate etching mask may be omitted, and the conductive pattern ML may be patterned.

Figure 32:
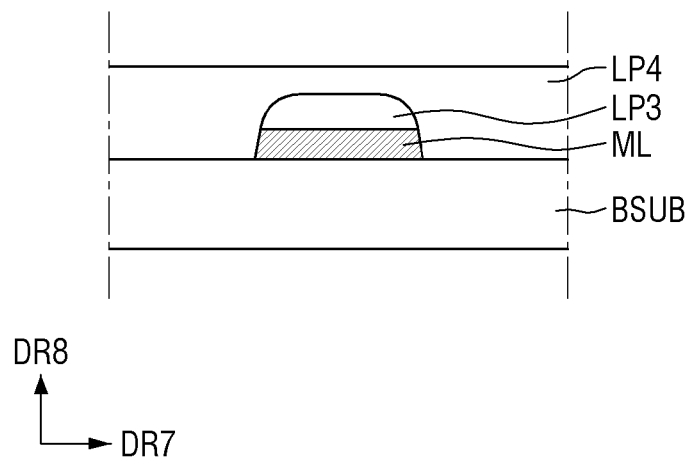

Subsequently, referring to FIG. 32, a fourth lower protective layer LP4 may be formed on the first substrate BSUB. The fourth lower protective layer LP4 may be disposed to cover the outer surfaces of the third lower protective layer LP3 and the conductive pattern ML to protect the third lower protective layer LP3 and the conductive pattern ML.

Although embodiments of the disclosure have been disclosed for illustrative purposes, those skilled in the art will appreciate that various modifications, additions and substitutions are possible, without departing from the scope and spirit of the disclosure.

What is claimed is:

1. A display device, comprising:

a display layer including pixels each including at least one transistor;

a connection wiring electrically connected to the at least one transistor and exposed to a lower surface of the display layer through a first contact hole in the display layer;

a base member disposed under the display layer and including a first hole exposing the connection wiring exposed to the lower surface of the display layer;

a first lower protective layer disposed on a lower surface of the base member and including a second hole overlapping the first hole in a thickness direction of the base member;

a pad portion disposed on a lower surface of the first lower protective layer; and a lead line disposed on the lower surface of the first lower protective layer and electrically connecting the pad portion and the connection wiring.

2. The display device of claim 1, wherein the first lower protective layer is not disposed on a side surface of the base member constituting a sidewall of the first hole.

3. The display device of claim 2, wherein the first lower protective layer completely overlaps the lower surface of the base member.

4. The display device of claim 3, wherein a side surface of the first lower protective layer constituting a sidewall of the second hole is aligned in parallel with the side surface of the base member constituting the sidewall of the first hole.

5. The display device of claim 3, wherein a side surface of the first lower protective layer constituting a sidewall of the second hole is aligned outward from the side surface of the base member constituting the sidewall of the first hole.

6. The display device of claim 5, wherein the first lower protective layer has an under-cut shape protruding from the side surface of the base member.

7. The display device of claim 1, wherein the lead line is electrically connected to the connection wiring through the first hole and the second hole.

8. The display device of claim 7, wherein the lead line extends from the lower surface of the first lower protective layer and is disposed on a side surface of the first lower protective layer constituting a sidewall of the second hole and a side surface of the base member constituting a sidewall of the first hole.

9. The display device of claim 1, further comprising:
a lead contact portion filling a space defined by the first hole and the second hole, wherein
the lead contact portion is electrically connected to the connection wiring through the first hole and the second hole, and
the lead line is electrically connected to the connection wiring through the lead contact portion.

10. The display device of claim 1, wherein the first lower protective layer exposes a part of the lower surface of the base member in an area adjacent to the first hole.

11. The display device of claim 1, wherein
the base member includes polyimide, and
the first lower protective layer includes a material having a different etching selectivity from a material of the base member.

12. The display device of claim 1, wherein the first lower protective layer includes an acrylic resin.

13. The display device of claim 1, further comprising:
a second lower protective layer overlapping the lower surface of the first lower protective layer and the lead line.

14. The display device of claim 1, wherein
the pad portion is spaced apart from the first contact hole, and
the lead line is disposed between the pad portion and the connection wiring.

15. The display device of claim 1, further comprising:
a barrier layer disposed between the display layer and the base member,
wherein the barrier layer includes:
a third hole exposing the connection wiring; and
the third hole is connected to the first hole.

16. A tiled display device, comprising:
a plurality of display devices each including a display area and a non-display area surrounding the display area,
wherein each of the plurality of display devices comprises:
a display layer including pixels each including at least one transistor;
a connection wiring electrically connected to the at least one transistor and exposed to a lower surface of the display layer through a first contact hole provided in the display layer;
a base member disposed under the display layer and including a first hole exposing the connection wiring exposed to the lower surface of the display layer;
a first lower protective layer disposed on a lower surface of the base member and including a second hole overlapping the first hole in a thickness direction of the base member;
a pad portion disposed on a lower surface of the first lower protective layer; and
a lead line disposed on the lower surface of the first lower protective layer and electrically connecting the pad portion and the connection wiring.

17. The tiled display device of claim 16, wherein the first lower protective layer is not disposed on a side surface of the base member constituting a sidewall of the first hole.

18. The tiled display device of claim 17, wherein the first lower protective layer completely overlaps the lower surface of the base member.

19. The tiled display device of claim 16, wherein
the base member includes polyimide, and
the first lower protective layer includes an acrylic resin.

20. The tiled display device of claim 16, wherein the lead line is electrically connected to the connection wiring through the first hole and the second hole.

* * * * *